(12) United States Patent
Hashimoto

(10) Patent No.: US 7,258,160 B2
(45) Date of Patent: Aug. 21, 2007

(54) HEAT TRANSFER ELEMENT, COOLING DEVICE AND ELECTRONIC DEVICE HAVING THE ELEMENT

(75) Inventor: Toshio Hashimoto, Tokyo (JP)

(73) Assignee: Sony Corporation, Tokyo (JP)

( * ) Notice: Subject to any disclaimer, the term of this patent is extended or adjusted under 35 U.S.C. 154(b) by 174 days.

(21) Appl. No.: 10/669,057

(22) Filed: Sep. 24, 2003

(65) Prior Publication Data

US 2004/0069462 A1   Apr. 15, 2004

(30) Foreign Application Priority Data

Sep. 25, 2002 (JP) .............. 2002-279728
Sep. 25, 2002 (JP) .............. 2002-279730

(51) Int. Cl.
*H05K 7/20* (2006.01)

(52) U.S. Cl. .................. 165/104.26; 165/104.33; 165/905; 361/700

(58) Field of Classification Search ......... 165/104.26, 165/104.33, 185
See application file for complete search history.

(56) References Cited

U.S. PATENT DOCUMENTS

| | | | | |
|---|---|---|---|---|
| 4,838,346 A | * | 6/1989 | Camarda et al. | 165/104.14 |
| 5,309,986 A | * | 5/1994 | Itoh | 165/104.26 |
| 5,642,776 A | * | 7/1997 | Meyer et al. | 165/104.26 |
| 6,585,039 B2 | * | 7/2003 | Sagal et al. | 165/185 |
| 2002/0124995 A1 | * | 9/2002 | Moon et al. | 165/104.11 |
| 2002/0157819 A1 | * | 10/2002 | Norley et al. | 165/185 |
| 2002/0166658 A1 | * | 11/2002 | Norley et al. | 165/185 |
| 2002/0195232 A1 | * | 12/2002 | Katsui | 165/104.33 |
| 2003/0116503 A1 | * | 6/2003 | Wang et al. | 210/660 |
| 2004/0194944 A1 | * | 10/2004 | Hendricks et al. | 165/181 |

FOREIGN PATENT DOCUMENTS

| | | |
|---|---|---|
| CN | 1037768 A | 12/1989 |
| CN | 1367642 A | 9/2002 |
| JP | 11-201670 | 7/1999 |
| JP | 2001-165584 | 6/2001 |
| JP | 2001-183080 | 7/2001 |
| JP | 2001-339026 | 12/2001 |
| JP | 2002-076223 | 3/2002 |
| JP | 2002-081875 | 3/2002 |
| JP | 2002-204091 A | 7/2002 |

OTHER PUBLICATIONS

"Heat Pipes in the Thermal Control of Electronic Components" of the third International Heat Pipe Symposium, 1988, pp. 2-11 with English Abstract.

* cited by examiner

*Primary Examiner*—Allen J. Flanigan
(74) *Attorney, Agent, or Firm*—Oblon, Spivak, McClelland, Maier & Neustadt, P.C.

(57) ABSTRACT

A heat transfer element includes a container having a heat input section for receiving heat generated by a heating element and a heat output section for radiating the heat outside, and condensable working fluid that is vacuum-sealed in the container to transfer the heat received from the heat input section to the heat output section and that is moved between the heat input section and the heat output section by a capillary action member. The container is composed of a resin containing a thermoconductive material. A cooling device includes the heat transfer element, a heat sink disposed adjacent to the heat output section to radiate the heat received from the heat output section, and a fan for supplying cooling air to the heat sink.

14 Claims, 27 Drawing Sheets

HEAT TRANSFER ELEMENT, COOLING DEVICE AND ELECTRONIC DEVICE HAVING THE ELEMENT

BACKGROUND OF THE INVENTION

1. Field of the Invention

The present invention relates to a heat transfer element disposed in a casing of an electronic device to transfer heat generated by a heating element in the electronic device, and to a cooling device and an electronic device having the heat transfer element.

2. Description of the Related Art

An electronic device, for example, a so-called notebook personal computer, includes a display section and a main body. The main body has a keyboard, and a heating element, such as a CPU (Central Processing Unit), disposed therein. The heating element generates heat during operation. In order to radiate heat of the heating element out of a casing of the main body, a cooling device is disposed in the casing.

This type of cooling device has a heat pipe. The heat pipe is also called a heat transfer element, and includes a metal container filled with condensable working fluid. Heat from the heating element is transmitted to a heat input section of the container, and the working fluid is thereby evaporated into vapor adjacent to the inner wall of the heat input section. The working fluid then moves to a heat output section of the container where the pressure and temperature are low, condenses adjacent to the inner wall of the heat output section, and emits latent heat of condensation.

In this way, heat from the heating element is radiated to, for example, a radiating fin in the heat output section by the heat pipe (for example, see Japanese Unexamined Patent Application Publication No. 2001-237579, page 5 and FIG. 9).

Containers of heat pipes are conventionally made of metal in order to increase-the thermal conductivity, as described above. With weight reduction of electronic devices, there is a demand to reduce the weight of the heat pipes. It is, however, difficult to further reduce the weight of the heat pipes made of metal.

Metal containers have a sealed structure in which they are hermetically sealed with their ends covered with caps to ensure a vacuum therein. Therefore, the containers are expensive and lack reliability because, for example, working fluid is apt to leak during actual use.

SUMMARY OF THE INVENTION

In order to solve the above problems, it is an object of the present invention to provide a lighter heat transfer element that ensures thermal conductivity and that is shaped more flexibly than a metal heat transfer element, and to provide a cooling device and an electronic device having the heat transfer element.

According to an aspect, the present invention provides a heat transfer element including a container having a heat input section for receiving heat generated by a heating element and a heat output section for radiating the heat outside, and composed of a resin containing a thermoconductive material, and condensable working fluid that is vacuum-sealed in the container to transfer the heat received by the heat input section to the heat output section and that is moved between the heat input section and the heat output section by a capillary action member provided in the container.

Since the container is composed of resin, its weight can be made smaller than that of a known metal container. The resin contains a thermoconductive material in order to increase thermal conductivity. Since the container is composed of resin, it can be easily shaped, for example, like a pipe, or be variously shaped.

The condensable working fluid inside the container can be reliably moved between the heat input section and the heat output section by the capillary action member. That is, when heat is transmitted from the heating element to the heat input section of the container, the working fluid evaporates into vapor. In this case, latent heat of vaporization is received from the heat input section, and simultaneously, the pressure of the vapor of the working fluid is increased by other sections of the container. Such a difference in vapor pressure inside the container allows the vapor of the working fluid to be moved from the heat input section to the heat output section.

Since the pressure and temperature are low in the heat output section, the vapor of the working fluid condenses at the inner wall of the heat output section, and emits latent heat of condensation. The condensed working fluid can reliably reflow to the heat input section by the capillary action member provided in the container.

Preferably, the thermoconductive material includes carbon nanotubes.

The resin can be decreased in heat resistance and can be increased in thermal conductivity by containing carbon nanotubes. Moreover, since the mechanical strength is increased, the thickness of the container can be reduced, and the heat resistance can be decreased further. Since the resin containing carbon nanotubes has an electromagnetic-wave absorbing ability, there is no need to prepare a functional component having an electromagnetic-wave shielding ability.

Preferably, the thermoconductive material includes graphite.

Graphite allows the resin to have a lower heat resistance and a higher thermal conductivity.

Preferably, the thermoconductive material includes insert-molded graphite sheets.

Graphite sheets allow the resin to have a lower heat resistance and a higher thermal conductivity.

Preferably, the thermoconductive material includes aluminum filler.

Aluminum filler allows the resin to have a lower heat resistance and a higher thermal conductivity.

Preferably, the thermoconductive material includes aluminum nitride filler.

Aluminum nitride filler allow the resin to have a lower heat resistance and a higher thermal conductivity.

Preferably, the capillary action member includes grooves provided between the heat input section and the heat output section inside the container.

Preferably, the capillary action member includes a mesh member provided between the heat input section and the heat output section inside the container.

Preferably, the capillary action member includes knurls provided between the heat input section and the heat output section inside the container.

Preferably, the capillary action member includes sintered powder provided between the heat input section and the heat output section inside the container.

According to another aspect, the present invention provides an electronic device having a heat transfer element disposed in a casing of the electronic device to transfer heat generated by a heating element, wherein the heat transfer element includes a container having a heat input section for receiving the heat generated by the heating element and a heat output section for radiating the heat outside, and composed of a resin containing a thermoconductive material, and condensable working fluid that is vacuum-sealed in the container to transfer the heat received by the heat input section to the heat output section and that is moved between the heat input section and the heat output section by a capillary action member provided in the container.

According to a further aspect, the present invention provides a cooling device including a heat transfer element that receives heat generated by a heating element from a heat input section and that radiates the heat transferred from the heat input section to the outside from a heat output section, a heat sink disposed adjacent to the heat output section of the heat transfer element to radiate the heat from the heat output section, and a fan that rotates to supply cooling air to the heat sink, wherein the heat transfer element includes a container having the heat input section and the heat output section, and composed of a resin containing a thermoconductive material, and condensable working fluid that is vacuum-sealed in the container to transfer the heat received by the heat input section to the heat output section and that is moved between the heat input section and the heat output section by a capillary action member provided in the container.

Since the container is composed of resin, its weight can be made smaller than that of a known metal container. The resin contains a thermoconductive material in order to increase its thermal conductivity. Since the container is composed of resin, it can be easily shaped, for example, like a pipe, or be variously shaped. Therefore, the cooling device can be flexibly shaped according to the shape of an electronic device in which it is to be mounted.

The condensable working fluid inside the container can be reliably moved between the heat input section and the heat output section by the capillary action member. That is, when heat is transmitted from the heating element to the heat input section of the container, the working fluid evaporates into vapor. In this case, latent heat of vaporization is received from the heat input section, and simultaneously, the pressure of the vapor of the working fluid is increased by other sections of the container. Such a difference in vapor pressure inside the container allows the vapor of the working fluid to be moved from the heat input section to the heat output section.

Since the pressure and temperature are low in the heat output section, the vapor of the working fluid condenses at the inner wall of the heat output section, and emits latent heat of condensation. The condensed working fluid can reliably reflow to the heat input section by the capillary action member provided in the container.

Preferably, the fan is disposed inside a housing that is formed integrally with the container.

Since the housing for the fan is formed integrally with the container, it is also composed of the same resin containing the thermoconductive material as that of the container. Therefore, the weight of the housing can be made smaller than that of a metal housing. Since the resin contains the thermoconductive material, its thermal conductivity is enhanced. Since the container and the housing are composed of resin, they can be integrally formed with ease.

According to a still further aspect, the present invention provides an electronic device having a cooling device for performing cooling by radiating heat generated by a heating element to the outside, wherein the cooling device includes a heat transfer element that receives the heat generated by the heating element from a heat input section and that radiates the heat transferred from the heat input section to the outside from a heat output section, a heat sink disposed adjacent to the heat output section of the heat transfer element to radiate the heat from the heat output section, and a fan that rotates to supply cooling air to the heat sink, wherein the heat transfer element includes a container having the heat input section and the heat output section, and composed of a resin containing a thermoconductive material, and condensable working fluid that is vacuum-sealed in the container to transfer the heat received by the heat input section to the heat output section and that is moved between the heat input section and the heat output section by a capillary action member provided in the container.

Further objects, features and advantages of the present invention will become apparent from the following description of the preferred embodiments (with reference to the attached drawings).

DESCRIPTION OF THE PREFERRED EMBODIMENTS

Preferred embodiments of the present invention will be described in detail below with reference to the attached drawings.

While various technically preferable restrictions are imposed on the following preferred embodiments, the scope of the present invention is not limited by the embodiments, unless otherwise specified.

Figure 1:
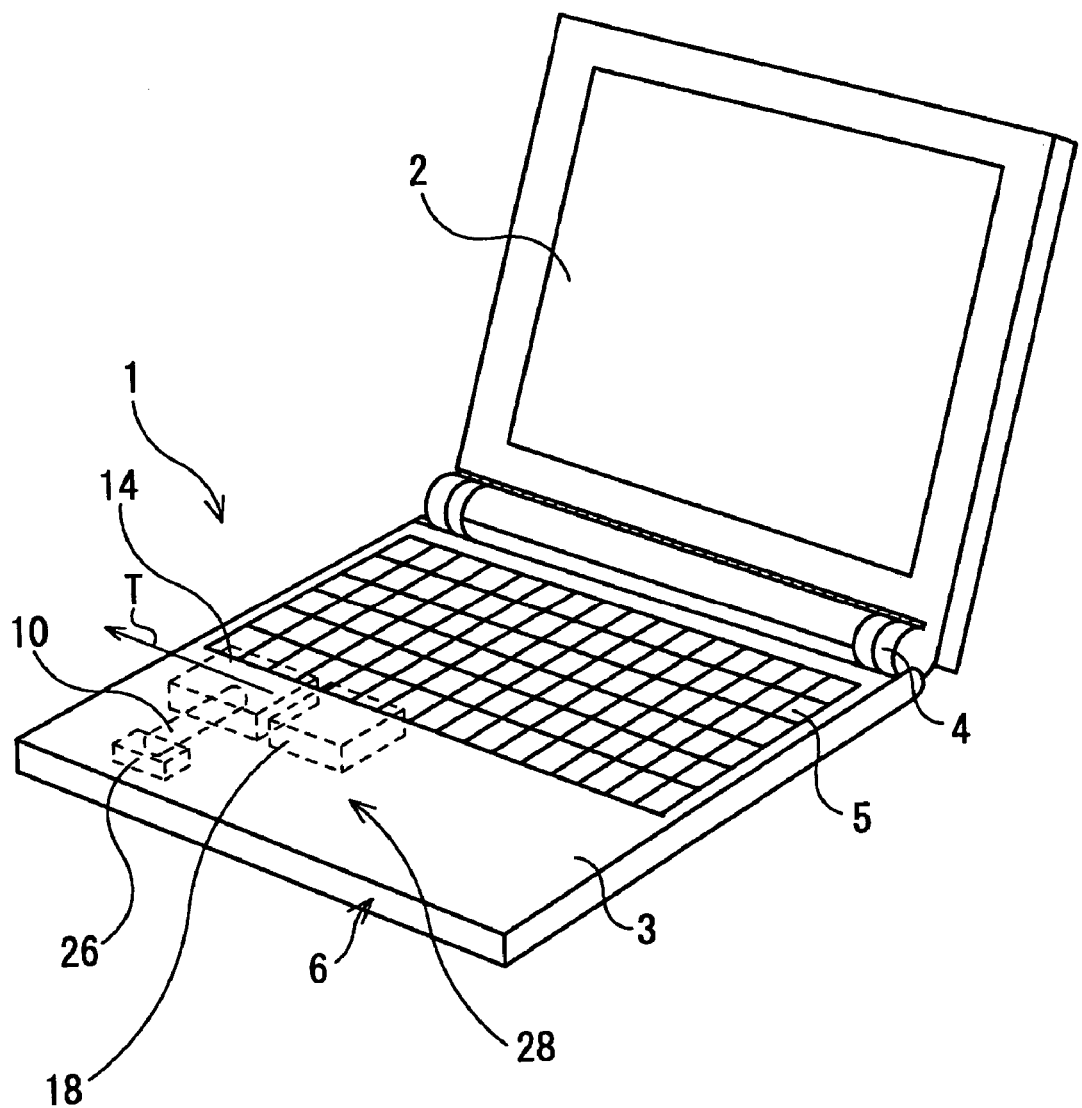
FIG. 1 is a perspective view showing an example of an electronic device having a heat transfer element according to a first embodiment of the present invention.

FIG. 1 shows a preferred example of an electronic device having a heat transfer element according to a first embodiment of the present invention.

In FIG. 1, a portable notebook computer 1 is shown as an example of an electronic device. The computer 1 includes a display section 2 and a main body 3. The display section 2 is pivotally connected to the main body 3 by a connecting section 4. The main body 3 includes a keyboard 5 and a casing 6. The keyboard 5 is provided on the upper side of the casing 6, and the casing 6 is made of plastic, metal, or the like. A cooling device 28 is disposed in the casing 6, and includes a heat transfer element 10, a heat sink 14, and a fan motor 18.

The heat transfer element 10 is also called a heat pipe. The heat transfer element 10 thermally connects a heating element, for example, a CPU 26, and the heat sink 14. The fan motor 18 is provided adjacent to the heat sink 14. By the rotation of a fan of the fan motor 18 to blow cooling air in the direction T, heat transmitted to the heat sink 14 can be radiated out of the casing 6.

Figure 2:
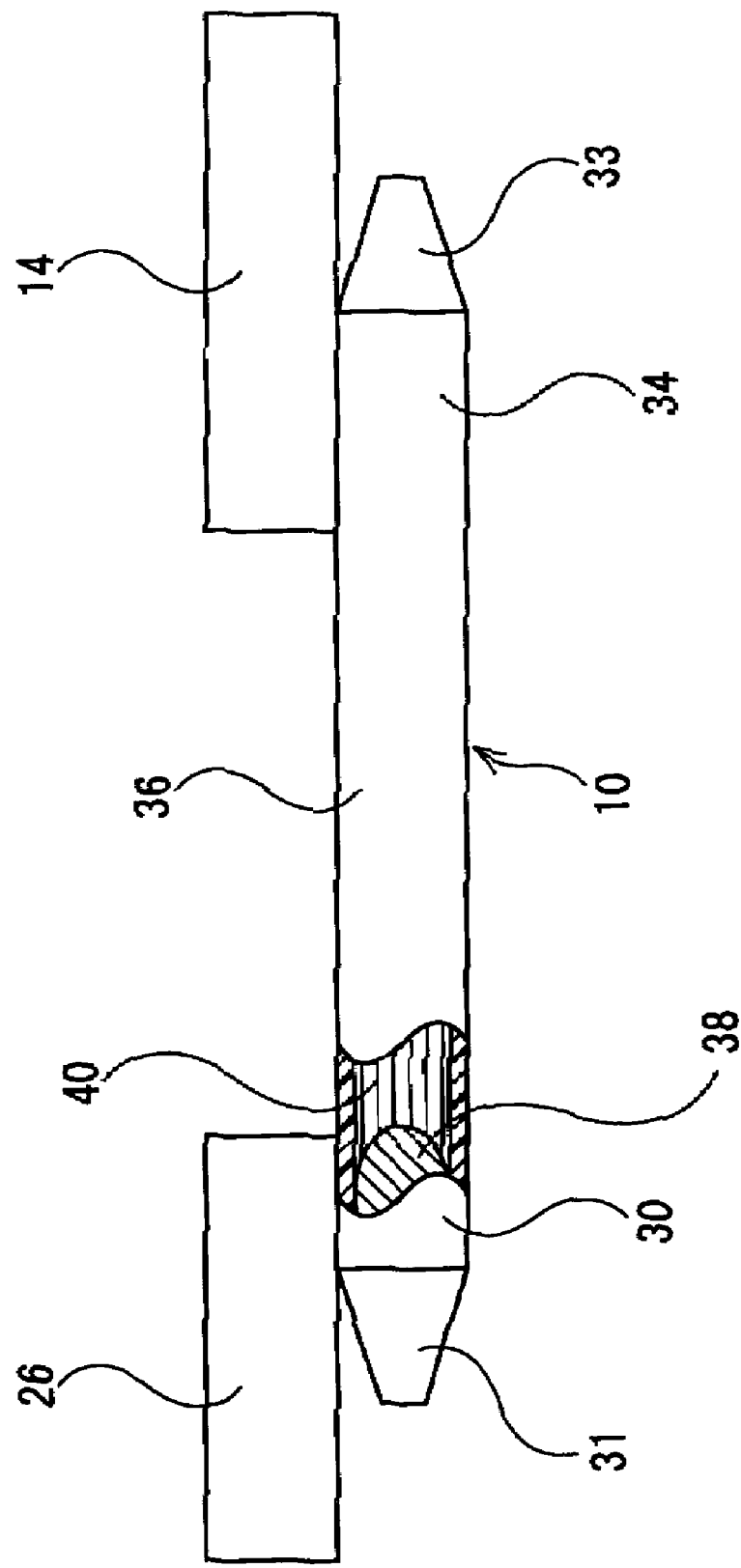
FIG. 2 is an enlarged view showing the heat transfer element shown in FIG. 1, a heating element, and a radiator.

FIG. 2 is an enlarged view showing the structures of the heat transfer element 10, the CPU 26, and the heat sink 14.

For example, the heat transfer element 10 is formed of a cylindrical member, and includes a cylindrical container 36 and condensable working fluid 38. One end of the container 36 serves as a heat input section 30, and the other end thereof serves as a heat output section 34.

The container 36 is made of a resin containing a thermoconductive material. The working fluid 38 is vacuum-sealed in the container 36.

The heat input section 30 of the heat transfer element 10 is thermally and mechanically connected to the CPU 26, and the heat output section 34 is thermally and mechanically connected to the heat sink 14.

Heat generated by the CPU 26 during operation is received by the heat input section 30, and is radiated from the heat output section 34 to the heat sink 14 by the action of the working fluid 38 in the heat transfer element 10.

The heat transmitted to the heat sink 14 can be radiated from the interior of the casing 6 to the outside in the direction T by cooling air generated by the fan motor 18 shown in FIG. 1.

Figure 3:
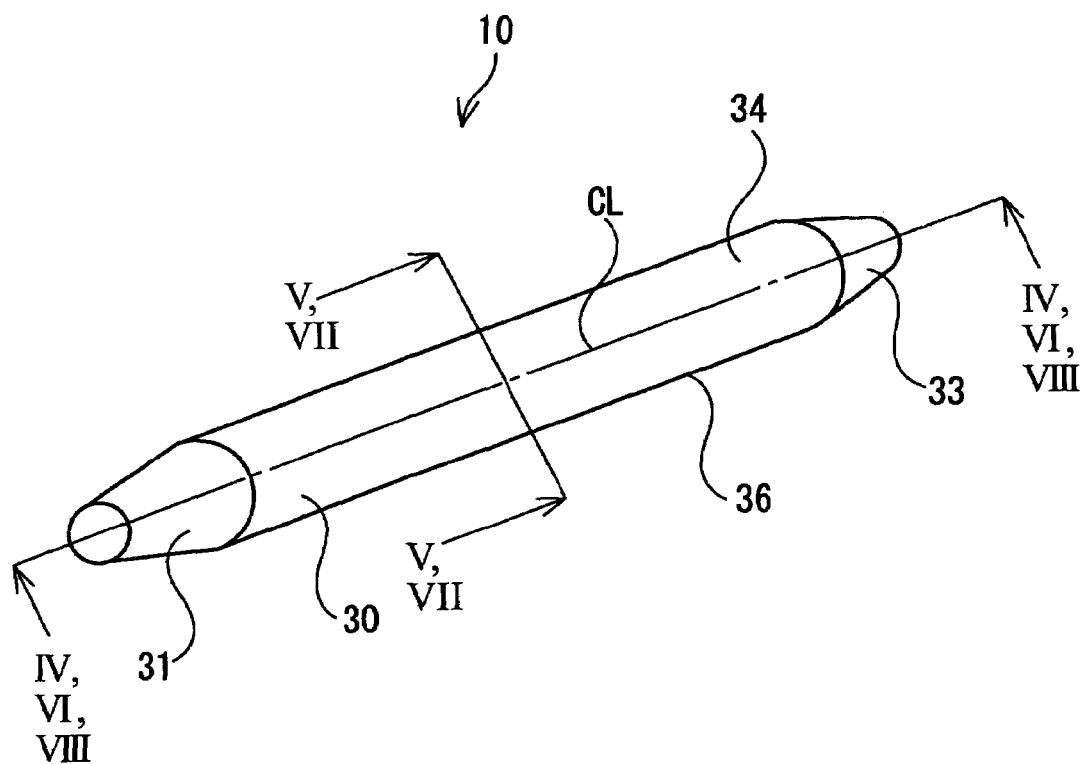
FIG. 3 is a perspective view of the heat transfer element.
Figure 4:
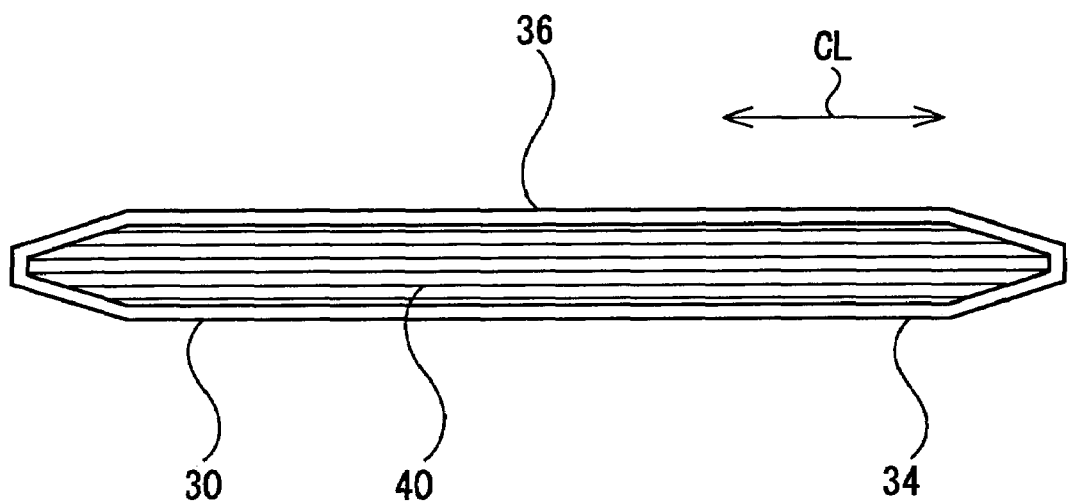
FIG. 4 is a sectional view of the heat transfer element, taken along line IV—IV in FIG. 3.
Figure 5:
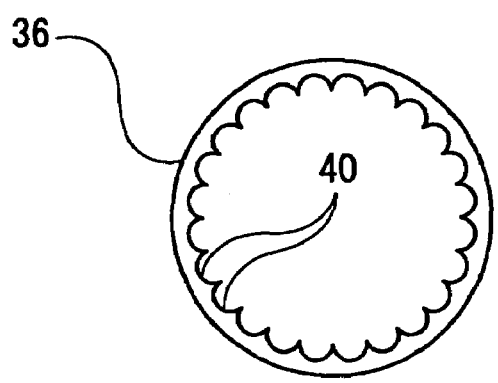
FIG. 5 is a sectional view of the heat transfer element, taken along line V—V in FIG. 3.

FIG. 3 shows the external appearance of the heat transfer element 10 shown in FIG. 2. FIG. 4 is an axial sectional view of the container 36 of the heat transfer element 10, taken along line IV—IV in FIG. 3. FIG. 5 is a cross-sectional view of the container 36, taken along line V—V in FIG. 3.

As shown in FIGS. 2 and 3, the container 36 is also called a tube, and the heat input section 30 of the container 36 is provided with a closed and tapered portion 31. Similarly, the heat output section 34 is provided with a closed and tapered portion 33.

The diameter of the container 36 from the heat input section 30 to the heat output section 34 is substantially constant.

As shown in FIG. 4, a plurality of grooves 40 extend in the axial direction CL from the tapered portion 31 to the tapered portion 33 inside the container 36. The grooves 40 are substantially semicircular, as shown in FIG. 5.

The grooves 40 serves as the capillary action member that moves the condensable working fluid 38 from the heat output section 34 to the heat input section 30.

As the condensable working fluid 38, for example, pure water, naphthalene, butane, or ethanol may be used.

While the resin that forms the container 36 may be, for example, nylon, polycarbonate (PC), polyimide (PI), or ABS (acrylonitrile butadiene styrene), it is not limited thereto.

It is particularly preferable to use liquid crystal polymer as the material of the container 36 because the liquid crystal polymer hardly produces out gas and contamination during fine plastic molding.

Out gas refers to a gas harmful to electrical contacts or the like containing chlorine or sulfur constituents, for example, siloxane, phthalic ester, or phosphoester.

Contamination refers to unintended impurities, such as solid matters, mixed in molding resin, and dust produced during molding.

Preferably, the resin container 36 contains a thermoconductive material, such as carbon nanotubes, graphite (carbon fiber), graphite sheets, aluminum filler, or aluminum nitride filler.

Carbon nanotubes or graphite is contained in the resin. Graphite sheets are insert-molded in the resin. Aluminum filler or aluminum nitride filler is contained in the resin.

Such a thermoconductive material can reduce the thermal resistance of the resin to enhance the thermal conductivity of the resin. By thus enhancing the thermal, heat can be easily transmitted from the CPU 26 shown in FIG. 2 to the working fluid 38 through the heat input section 30, and from the working fluid 38 to the heat sink 14 through the heat output section 34.

Carbon nanotubes as the thermoconductive material are contained in the resin, as described above. The carbon nanotubes serve not only to reduce the thermal resistance of the resin in order to enhance the thermal conductivity, as described above, but also to increase the mechanical strength of the resin.

For this reason, the thickness of the outer wall of the container 36 can be made smaller than that of the metal container 36, and the thermal resistance of the container 36 can be reduced.

The resin container 36 can be made lighter, can be more easily produced, and can be more easily filled with the working fluid 38 than the metal container.

The resin containing carbon nanotubes allows the container 36 to also have an electromagnetic-wave absorbing ability. Therefore, there is no need to add, to the container 36, a separate functional member having an electromagnetic-wave shielding ability.

A carbon nanotube is a substance shaped like a microtube of the order of nanometers (a "nanometer" is equal to one-billionth of a meter) formed by linking carbon atoms in a reticular form. The carbon nanotube has unique characteristics that have not provided by other substances, for example, a thermal conductivity higher than that of metal, light weight, and a strength equivalent to that of diamond.

Graphite is an allotropic form of carbon. A graphite sheet is a sheet of graphite that has an orderly crystal orientation and that is similar to diamond. The graphite sheet has a thermal conductivity that is the highest next to diamond, and that is higher than metal such as copper and aluminum. Graphite sheets are insert-molded when the container 36 is molded from resin.

Aluminum filler and aluminum nitride filler serve to enhance the thermal conductivity of the resin.

The operation of the above-described heat transfer element 10 will now be described.

Referring to FIG. 1, when a user activates the computer 1, the CPU 26 starts and generates heat. The heat of the CPU 26 is applied to the heat input section 30 of the heat transfer element 10 shown in FIGS. 2 and 3. The condensable working fluid 38 is held in the grooves 40 extending inside the heat input section 30, and is easily evaporated into vapor by the heat applied from the CPU 26 to the heat input section 30. In this case, latent heat of vaporization of the working fluid 38 is received, and simultaneously, the vapor of the working fluid 38 is increased in pressure by other portions inside the container 36.

This difference in vapor pressure inside the container 36 allows the vapor of the working fluid 38 to flow from the heat input section 30 to the heat output section 34, and condenses in a portion of low pressure and low temperature, that is, at the inner wall of the container 36. During condensation, the working fluid 38 emits latent heat of condensation. The emitted latent heat of condensation is transmitted to the heat sink 14 through the heat output section 34, and is then radiated out of the casing 6 in the direction T by cooling air from the fan motor 18 shown in FIG. 1.

Referring again to FIG. 2, the condensed working fluid 38 reflows from the heat output section 34 to the heat input section 30 by a capillary action of the grooves 40.

In this way, heat generated by the CPU 26 can be transferred to the heat sink 14 by means of the working fluid 38 held inside the container 36 of the heat transfer element 10.

A first modification of the heat transfer element 10 in the first embodiment will now be described with reference to FIGS. 6 and 7.

Figure 6:
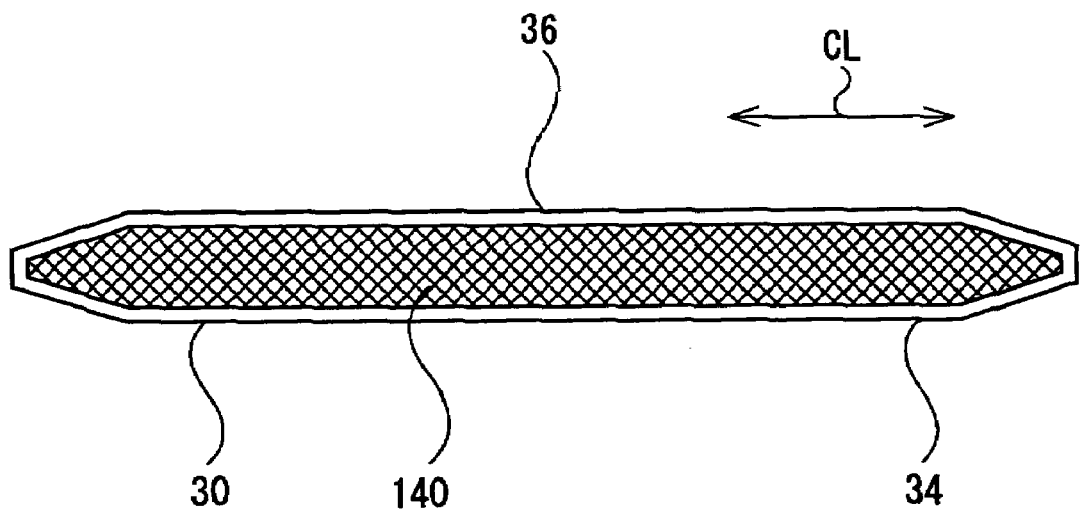
FIG. 6 is a cross-sectional view of a heat transfer element as a first modification of the first embodiment, taken along line VI—VI in FIG. 3.
Figure 7:
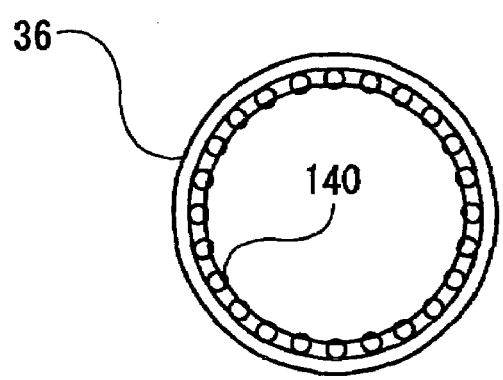
FIG. 7 is a cross-sectional view of the heat transfer element shown in FIG. 6, taken along line VII—VII in FIG. 3.

FIG. 6 is a sectional view of the container 36 of the heat transfer element 10, taken along line VI—VI in FIG. 3, and FIG. 7 is a sectional view of the container 36, taken along line VII—VII in FIG. 3.

Instead of the grooves 40 shown in FIG. 4, a mesh member 140 is provided as the capillary action member on the inner peripheral surface of the container 36, as shown in FIGS. 6 and 7. The mesh member 140 is made of a highly conductive metal such as copper or aluminum.

Such a mesh member 140 has a function, similar to that of the grooves 40 shown in FIG. 4, of causing working fluid 38 at the heat output section 34 to reflow to the heat input section 30 by a capillary action.

Figure 8:
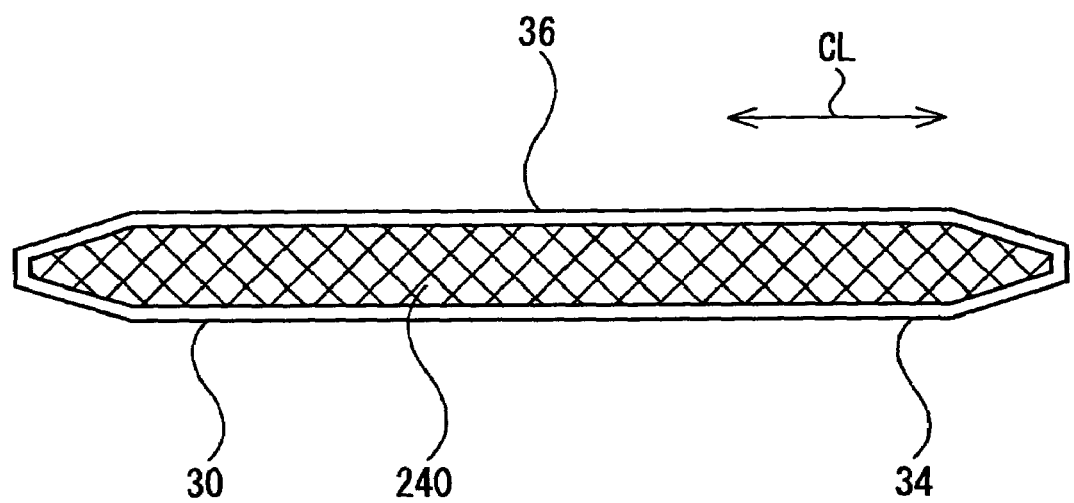
FIG. 8 is a cross-sectional view of a heat transfer element as a second modification of the first embodiment, taken along line VIII—VIII in FIG. 3.

FIG. 8 is a sectional view showing a second modification of the heat transfer element 10, taken along line VIII—VIII in FIG. 3. In FIG. 8, instead of the grooves 40 shown in FIG. 4, knurls 240 are provided as the capillary action member on the inner peripheral surface of the container 36. The knurls 240 also have a function of causing working fluid 38 at the heat output section 34 to reflow to the heat input section 30 by a capillary action thereof.

The mesh member 140 shown in FIG. 6 and the knurls 240 shown in FIG. 8 both function as the capillary action member, in a manner similar to that in the grooves 40 shown in FIG. 4.

Figure 9:
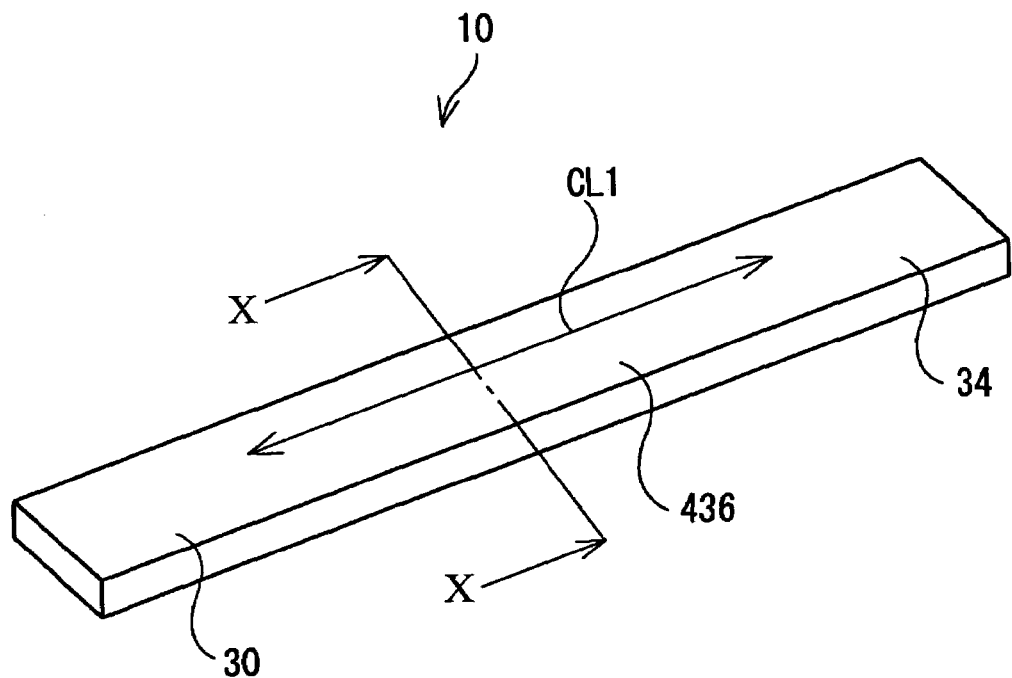
FIG. 9 is a perspective view of a heat transfer element as a third modification of the first embodiment.
Figure 10:
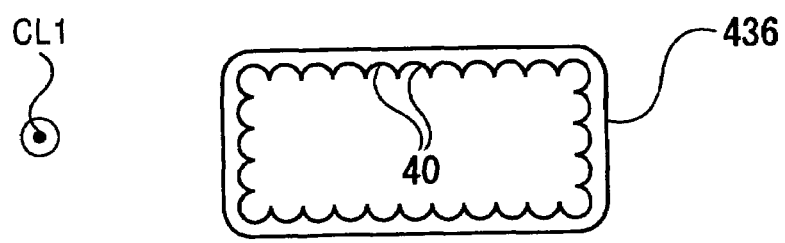
FIG. 10 is a cross-sectional view of the heat transfer element, taken along line X—X in FIG. 9.

FIG. 9 is a perspective view showing a third modification of the heat transfer element 10, and FIG. 10 is a cross-sectional view of the heat transfer element 10, taken along line X—X in FIG. 9.

A container 436 of the heat transfer element 10 shown in FIGS. 9 and 10 includes a heat input section 30 and a heat output section 34. The container 436 is shaped like a plate or a flat plate, which is different from the container 36 shown in FIG. 3, and is also referred to as a flat heat pipe.

As shown in FIG. 10, a plurality of grooves 40 extend in the longitudinal direction CL1 on the inner peripheral surface of the container 436. The groves 40 also function as the capillary action member, in a manner similar to that of the grooves 40 shown in FIG. 4.

The shapes of the heat transfer elements 10 shown in FIGS. 3 and 9 may be selected according to the shape of the electronic device shown in FIG. 1 and the layout of the components.

While grooves, a mesh member, and knurls have been given as examples of the capillary action member, sintered powder may also be used. Sintered powder is provided between the heat input section and the heat output section inside the container, and, is made of, for example, pure copper.

The sintered powder has a function of causing working fluid at the heat output section to reflow to the heat input section by a capillary action.

Figure 11:
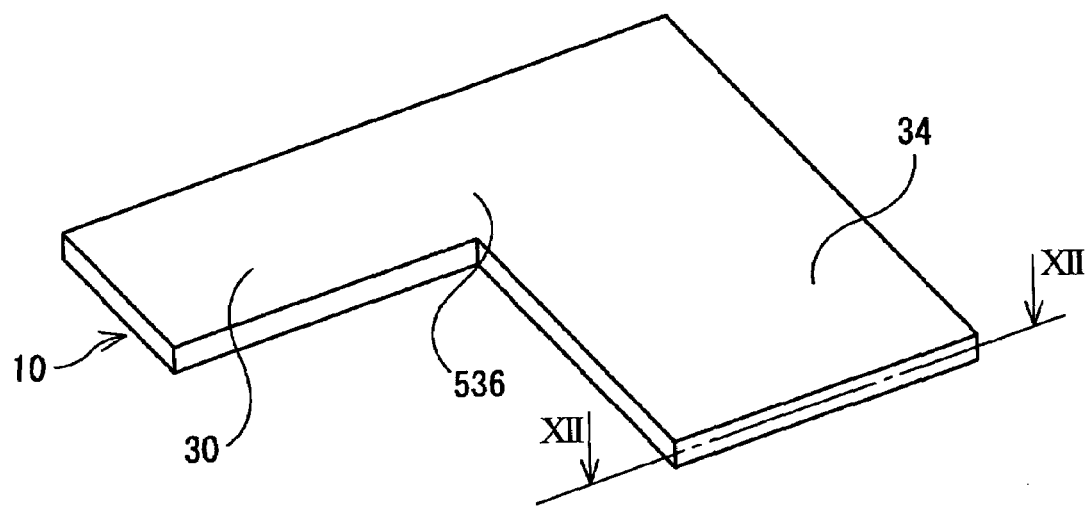
FIG. 11 is a perspective view of a heat transfer element as a fourth modification of the first embodiment; element, taken along line XII—XII in FIG. 11.
Figure 12:
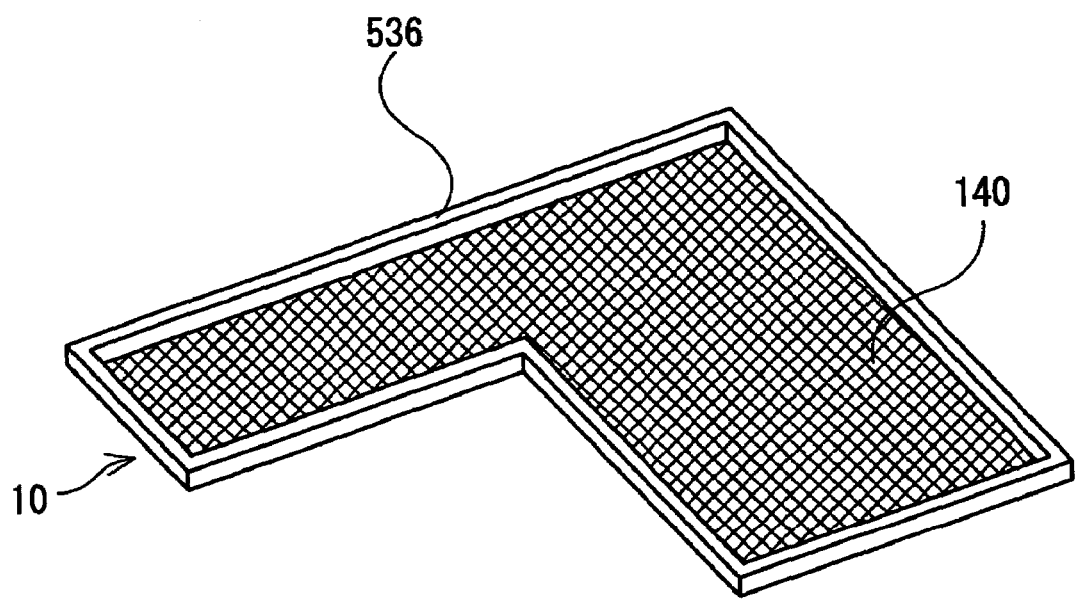

FIGS. 11 and 12 show a fourth modification of the heat transfer element 10.

Referring to FIG. 11, the heat transfer element 10 is a substantially L-shaped flat heat pipe. A container 536 of the heat transfer element 10 includes a heat input section 30 and a heat output section 34.

FIG. 12 is a sectional view of the heat transfer element 10, taken along line XII—XII in FIG. 11. As the capillary action member, for example, a mesh member 140 is provided on the entire inner surface of the container 536.

In the modifications shown in FIGS. 9 and 10 and in FIGS. 11 and 12, any of grooves, a mesh member, knurls, and sintered powder may be adopted as the capillary action member.

Figure 13:
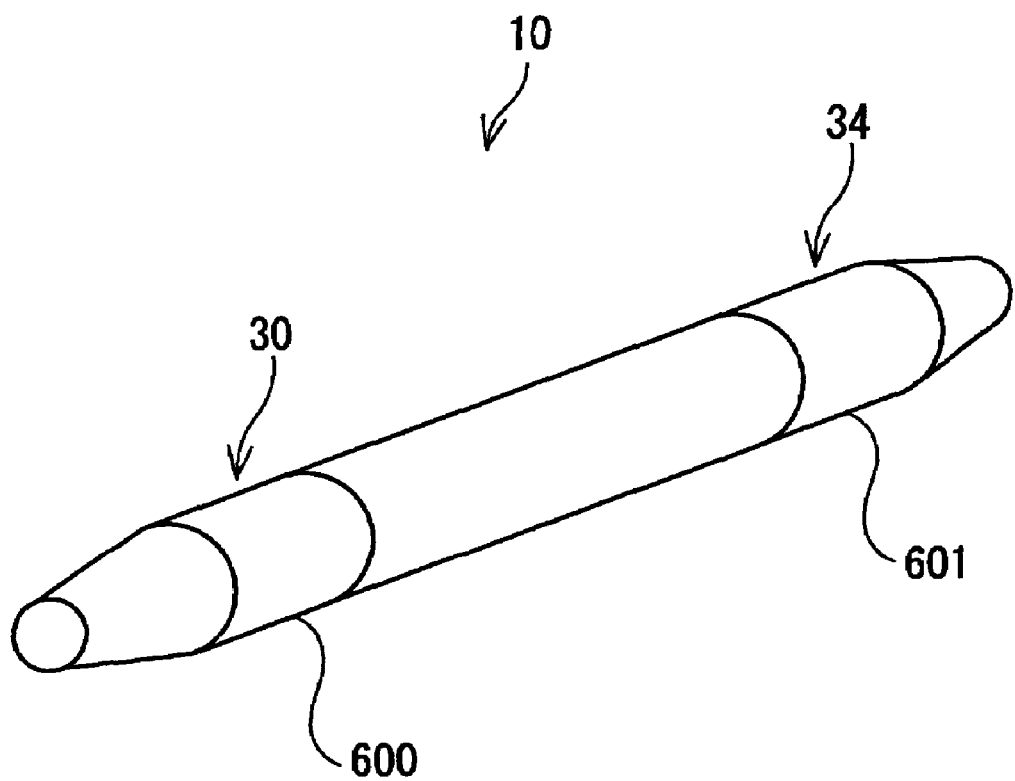
FIG. 13 is a perspective view of a heat transfer element as a fifth modification of the first embodiment.

FIG. 13 shows a fifth modification of the heat transfer element 10.

In the heat transfer element 10 of the fifth modification in FIG. 13, a heat input section 30 and a heat output section 34 are provided, respectively, with metal-plated portions 600 and 601 to further increase the thermal conductivity. The metal-plated portions 600 and 601 may be, of course, formed, for example, bonding a metal plate, instead of plating. The metal-plated portions 600 and 601 may be composed of, for example, copper or aluminum.

Figure 14:
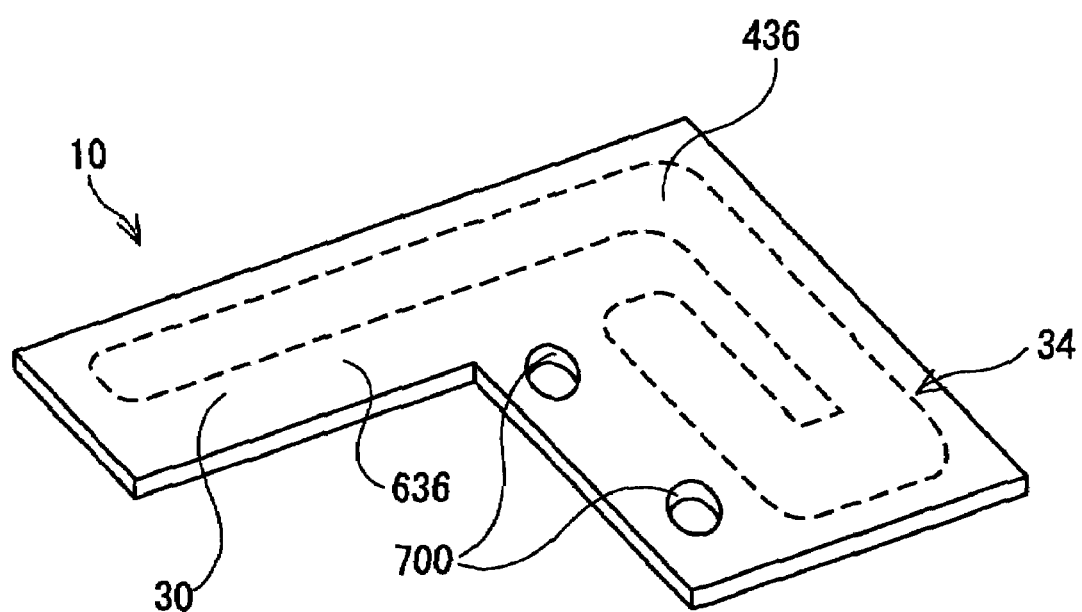
FIG. 14 is a perspective view of a heat transfer element as a sixth modification of the first embodiment.

FIG. 14 shows a sixth modification of the heat transfer element 10.

While the heat transfer element 10 shown in FIG. 14 has an external shape substantially equivalent to that of the heat transfer element 10 shown in FIG. 11, a container 436 of a flat heat pipe type, as in FIG. 9, is incorporated between a heat input section 30 and a heat output section 34 of the heat transfer element 10. The container 436 is bent, for example, in an L-form. Holes 700 are provided as screw holes at a midpoint of the container 436, in which screws are passed through to fasten the heat transfer element 10 to, for example, a casing of an electronic device.

Figure 15:
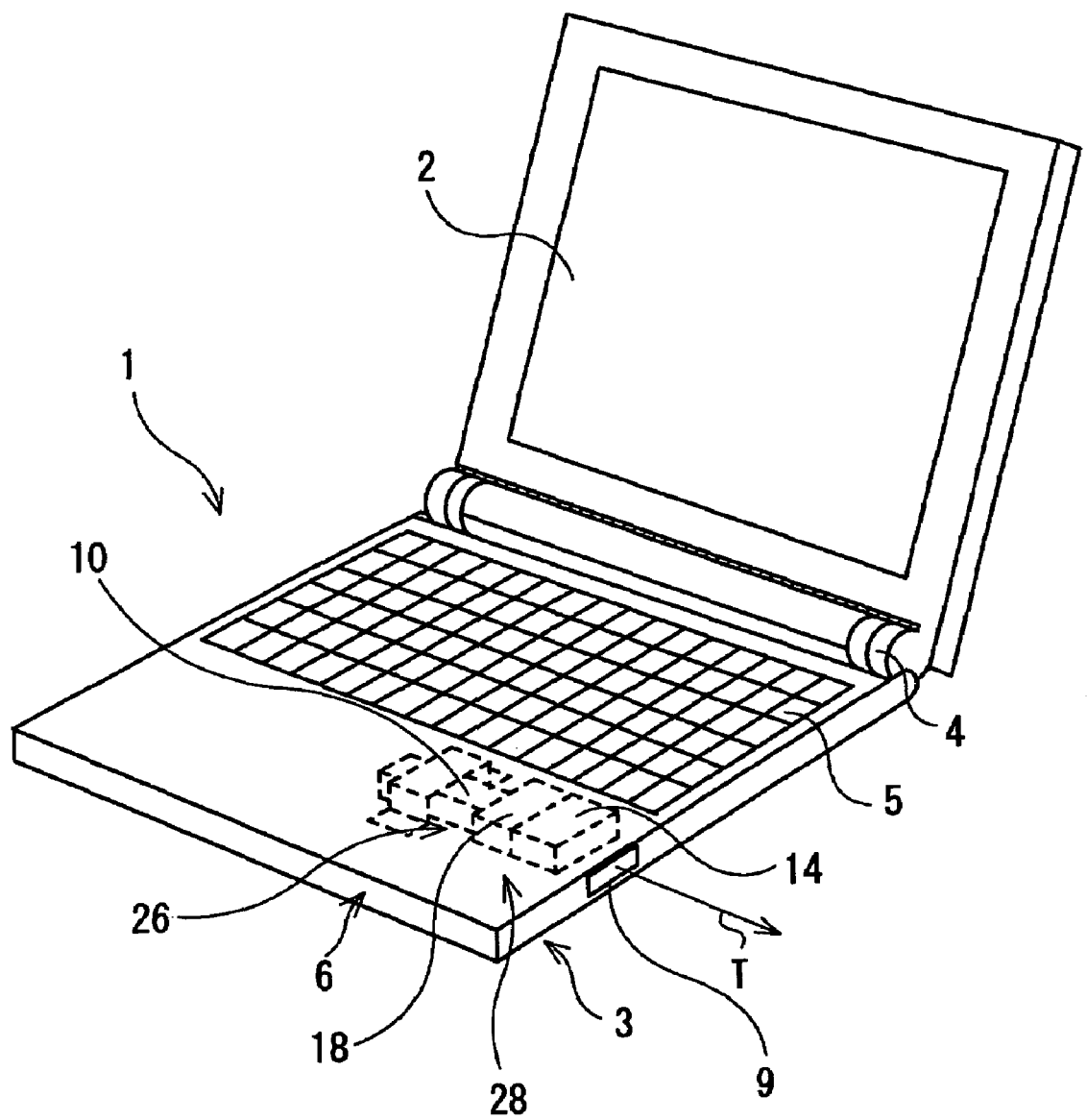
FIG. 15 is a perspective view of an example of an electronic device having a cooling device according to a second embodiment of the present invention.

FIG. 15 shows an electronic device having a cooling device according to a second embodiment of the present invention.

In FIG. 15, a portable notebook computer 1 is shown as an example of an electronic device. The computer 1 includes a display section 2 and a main body 3. The display section 2 is pivotally connected to the main body 3 by a connecting section 4. The main body 3 includes a keyboard 5 and a casing 6. The keyboard 5 is provided on the upper side of the casing 6, and the casing 6 is made of plastic, metal, or the like. A cooling device 28 is contained in the casing 6.

Figure 16:
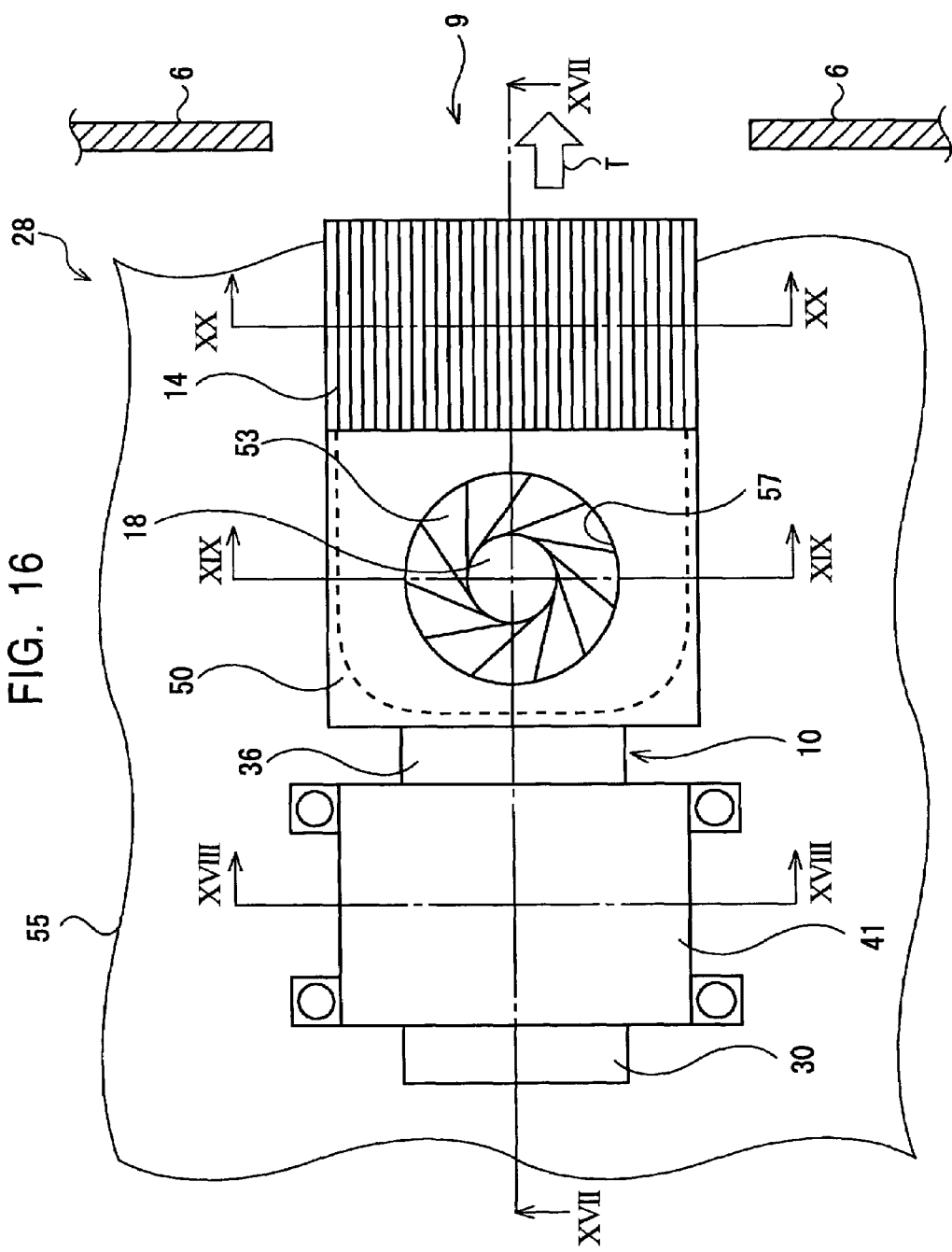
FIG. 16 is a plan view showing the configuration of the cooling device shown in FIG. 15.

FIG. 16 is a plan view of the cooling device 28 shown in FIG. 15. The cooling device 28 is fixed inside the casing 6 adjacent to an exhaust vent 9, and includes a heat transfer element 10, a heat block 41, a housing 50, a fan motor 18, a fan 53, and a heat sink 14.

Figure 17:
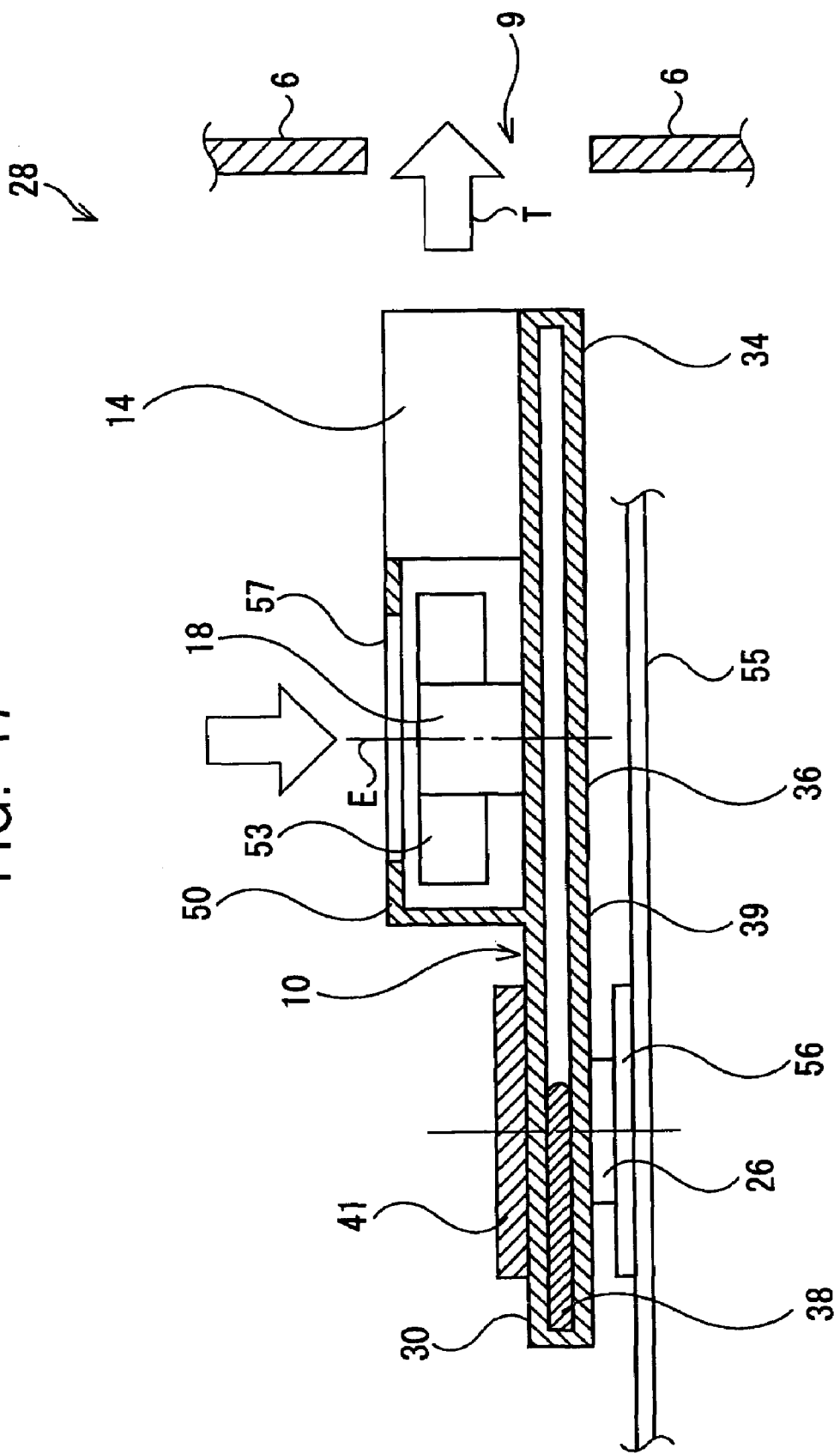
FIG. 17 is a cross-sectional view of the cooling device, taken along line XVII—XVII in FIG. 16.

FIG. 17 is a cross-sectional view, taken along line XVII—XVII in FIG. 16.

A base plate 55 is disposed inside the casing 6 shown in FIG. 15. A CPU 26 is mounted on the base plate 55 with a die base 56 therebetween. The CPU 26 is a heating element that generates heat when the computer 1 shown in FIG. 15 is operated by the application of electricity to the base plate 55. The CPU 26 is fixed to the die base 56, and is electrically connected to the base plate 55.

For example, the heat transfer element 10 is a container of rectangular cross section, as shown in FIGS. 16 and 17, and is called, for example, a heat pipe. The heat transfer element 10 includes a container 36 and condensable working fluid 38. One end of the container 36 of the heat transfer element 10 serves as a heat input section 30, and the other end thereof serves as a heat output section 34. The container 36 is composed of a resin containing a thermoconductive material. The working fluid 38 is vacuum-sealed in the container 36.

As shown in FIGS. 16 and 17, the heat input section 30 is thermally and mechanically connected to a surface of the CPU 26 remote from the base plate 55 in tight contact therewith by the heat block 41, and the heat output section 34 is thermally and mechanically connected to the heat sink 14.

Heat generated by the CPU 26 during operation is received by the heat input section 30, and is radiated from the heat output section 34 to the heat sink 14 by a heat-transferring action of the working fluid 38 in the heat transfer element 10.

The heat transmitted to the heat sink 14 can be radiated out of the casing 6 through the exhaust vent 9 in the direction T by cooling air produced by a plurality of blades in the fan 53 of the fan motor 18.

As shown in FIGS. 16 and 17, the housing 5 contains the fan motor 18 and the fan 53. The housing 5 is formed integrally with the container 36, and is made of the same material as that of the container 36. That is, the housing 50 and the container 36 are integrally made of a resin containing a thermoconductive material in order to enhance the thermal conductivity, as described above.

An intake vent 57 is provided on the upper side of the housing 50. The intake vent 57 is a circular aperture having an inner diameter slightly smaller than the outermost diameter of the fan 53.

The fan motor 18 continuously rotates the fan 53 on the center axis E. By the continuous rotation of the fan 53, cooling air is supplied toward the heat sink 14 in the direction T to forcibly cool the heat sink 14.

Figure 18:
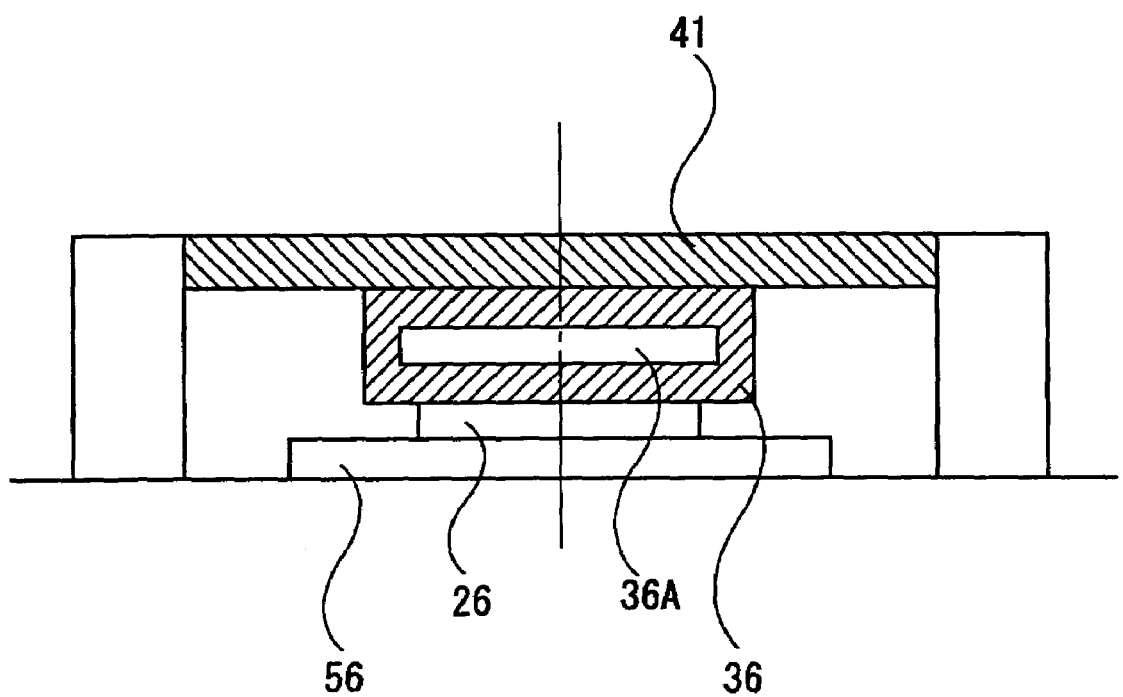
FIG. 18 is a cross-sectional view of the cooling device, taken along line XVIII—XVIII in FIG. 16.
Figure 19:
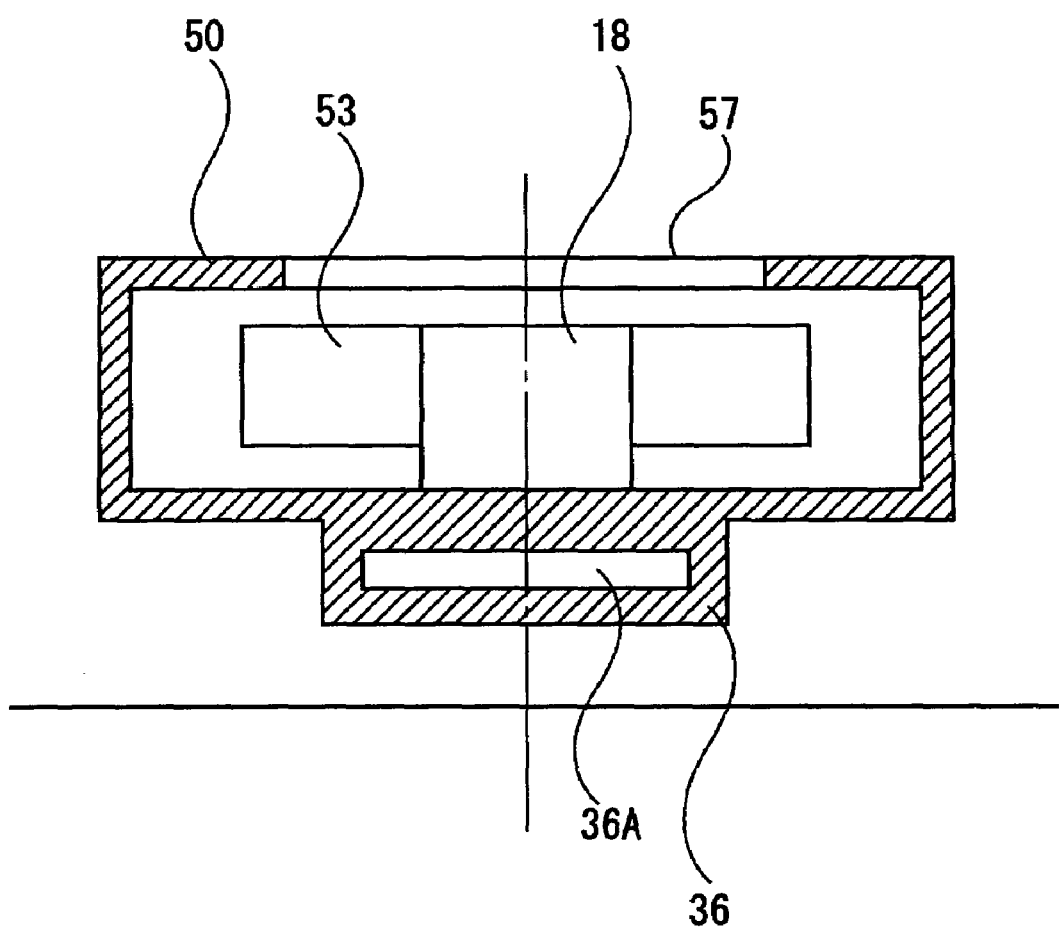
FIG. 19 is a cross-sectional view of the cooling device, taken along line XIX—XIX in FIG. 16.
Figure 20:
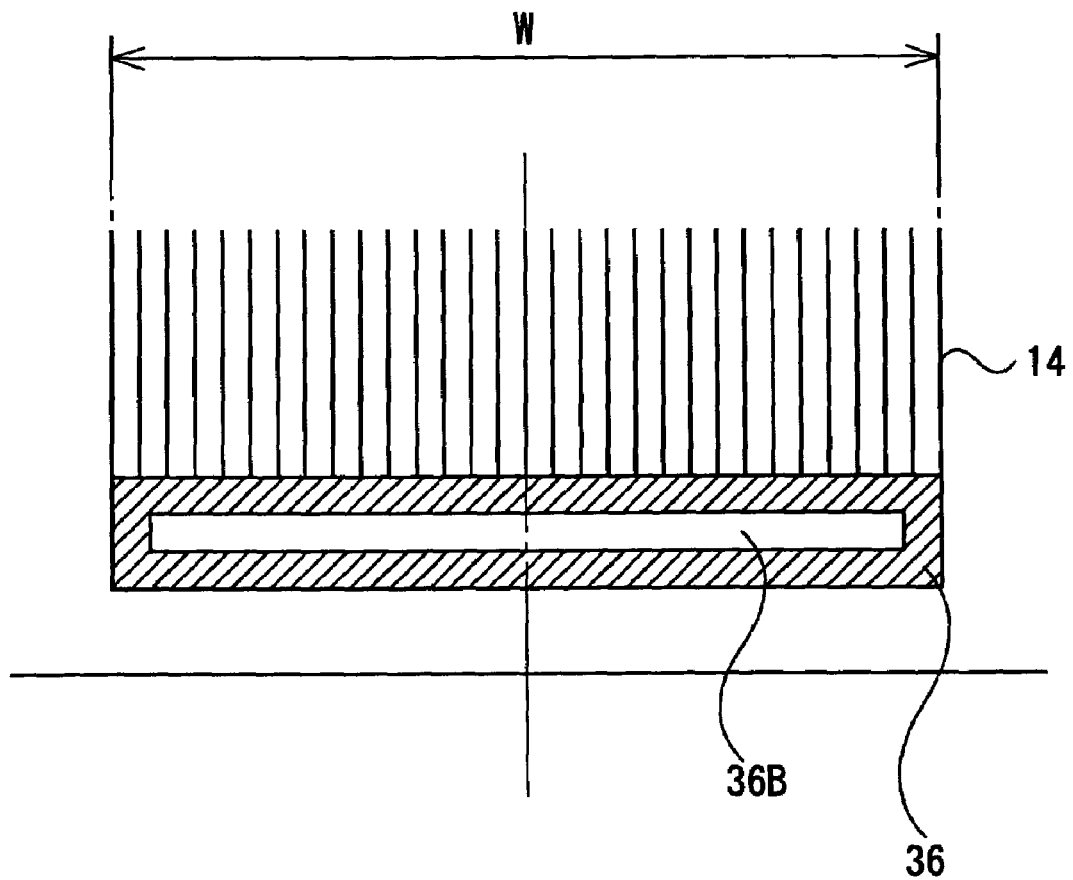
FIG. 20 is a cross-sectional view of the cooling device, taken along line XX—XX in FIG. 16.

FIGS. 18, 19, and 20 are cross-sectional views of the cooling device 28, respectively, taken along lines XVIII—XVIII, XIX—XIX, and XX—XX in FIG. 16.

A description will be given of the shape of the container 36 shown in FIGS. 16 and 17. Referring to FIGS. 18 and 19, the heat input section 30 and a middle section 39 respectively have inner spaces 36A of the same size. In contrast, an inner space 36B of the heat output section 34 is wider than the inner spaces 36A, corresponding to the width W of the heat sink 14, as shown in FIG. 20.

Figure 21:
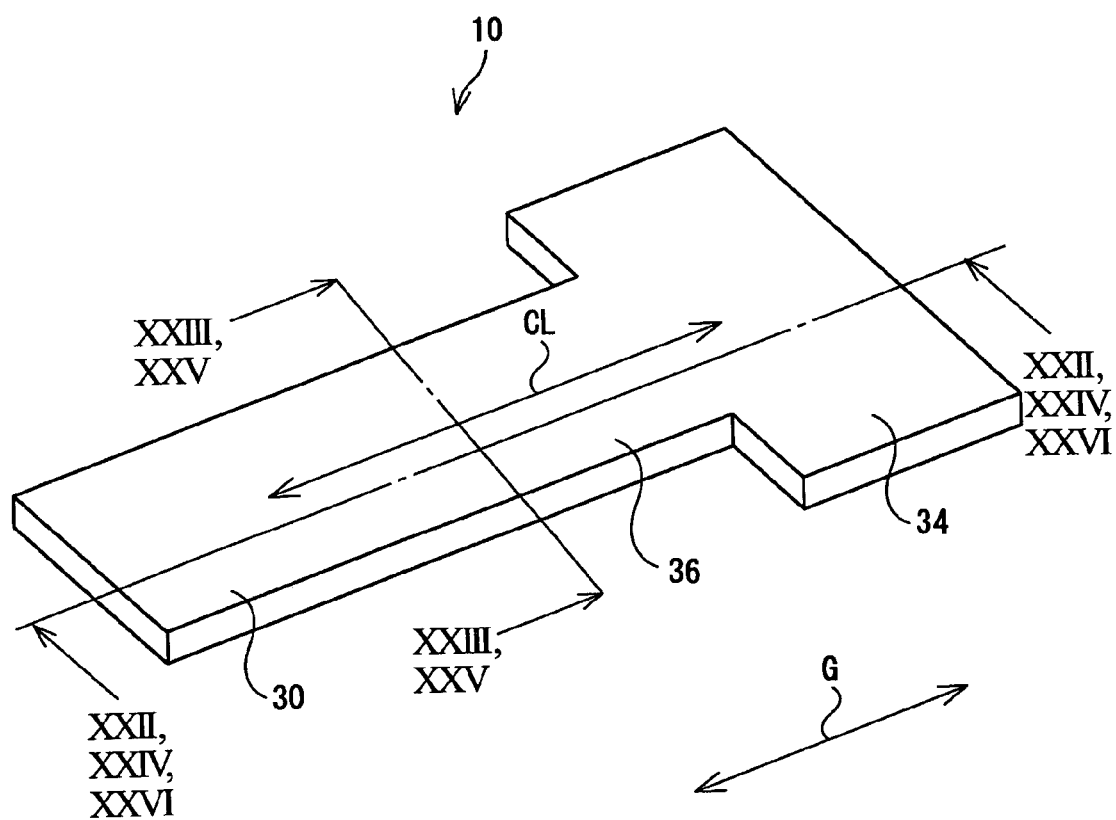
FIG. 21 is a perspective view showing an example of a shape of a container in the cooling device.
Figure 22:
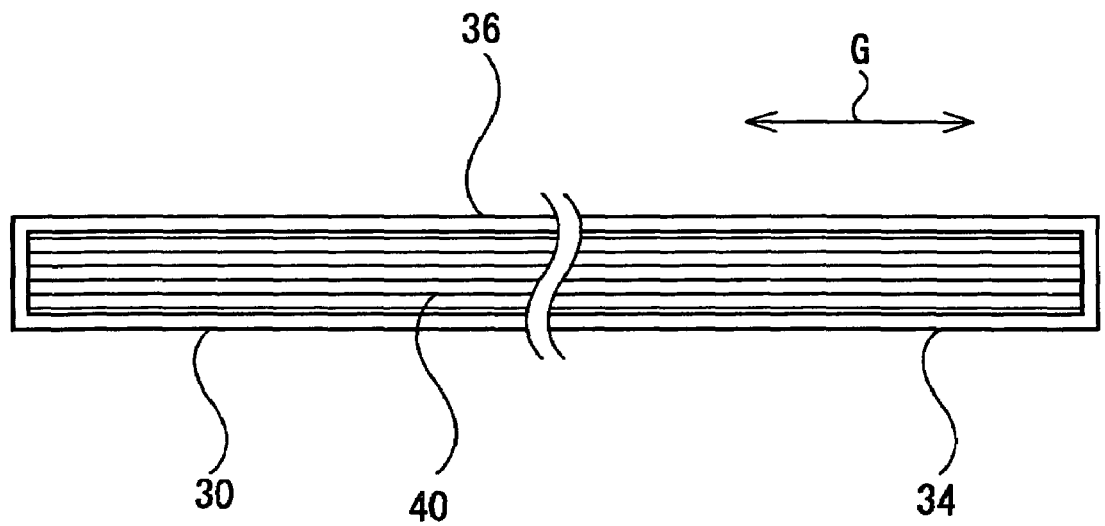
FIG. 22 is a cross-sectional view of the container, taken along line XXII—XXII in FIG. 21.
Figure 23:
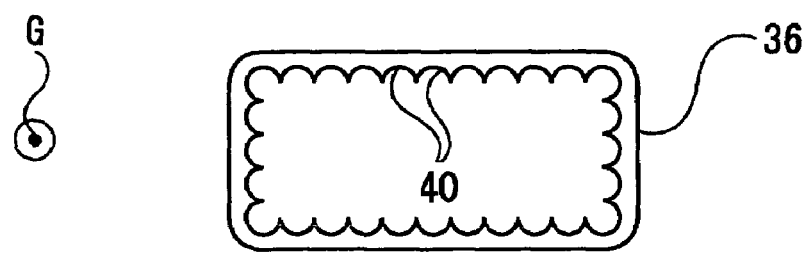
FIG. 23 is a cross-sectional view of the container, taken along line XXIII—XXIII in FIG. 21.

FIG. 21 shows an example of an outer shape of the above-described container 36, FIG. 22 is a sectional view of the container 36 in the longitudinal direction G, taken along line XXII—XXII in FIG. 21, and FIG. 23 is a cross-sectional view, taken along line XXIII—XXIII in FIG. 21.

As shown in FIGS. 22 and 23, a plurality of substantially semicircular grooves 40 extend inside the container 36 in the longitudinal direction G. The grooves 40 serves as the capillary action member that moves the condensable working fluid 38 from the heat output section 34 to the heat input section 30.

As the condensable working fluid, a material similar to that in the above-described first embodiment may be used.

The material of the container 36 may also be similar to that in the first embodiment.

Since the container 36 and the housing 50 shown in FIGS. 16 and 17 are integrally molded from the same resin, as described above, they are made of the same resin containing a thermoconductive material.

The thermoconductive material contained in the resin may be similar to that in the first embodiment.

In a case in which the resin contains carbon nanotubes as the thermoconductive material, the thermal resistance is reduced, and the thermal conductivity and mechanical strength are increased.

Therefore, the thicknesses of the outer walls of the container 36 and the housing 50 can be made smaller than those of a metal container and a metal housing, and the thermal resistance thereof can be reduced.

The resin container 36 and the resin housing 50 can be made lighter, can be more easily produced, and can be more easily filled with the working fluid 38 than the metal container and the metal housing. In addition, since the container 36 and the housing 50 are integrally molded, the number of components is reduced, compared with they are separately produced.

The resin containing carbon nanotubes allows the container 36 and the housing 50 to also have an electromagnetic-wave absorbing ability. Therefore, there is no need to add, to the container 36 and the housing 50, a separate functional member having an electromagnetic-wave shielding ability.

The heat transfer element 10 and the cooling device 28 operate in a manner similar to that in the above first embodiment.

A first modification of the heat transfer element 10 of the second embodiment will now be described with reference to FIGS. 24 and 25.

Figure 24:
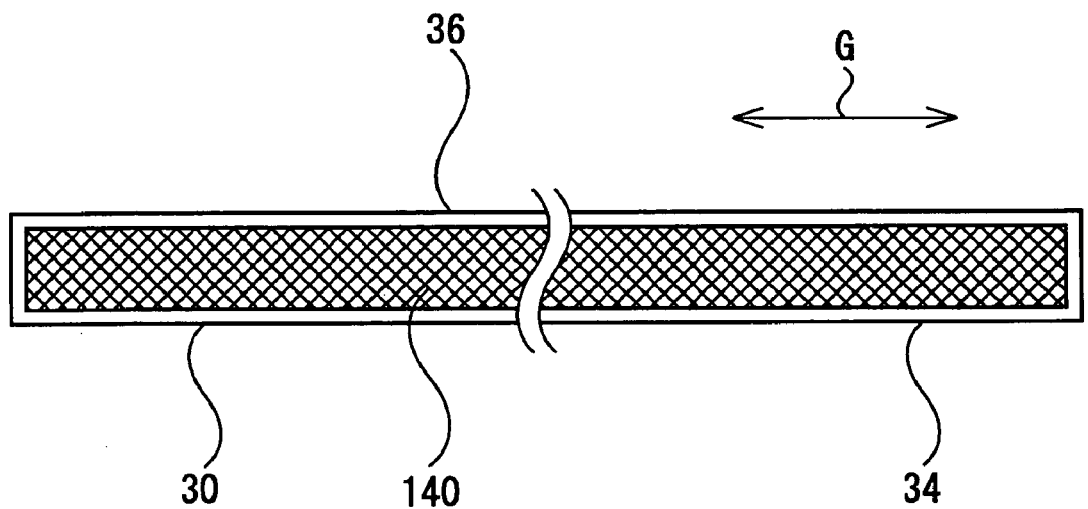
FIG. 24 is a cross-sectional view showing a modification of the container, taken along line XXIV—XXIV in FIG. 21.
Figure 25:
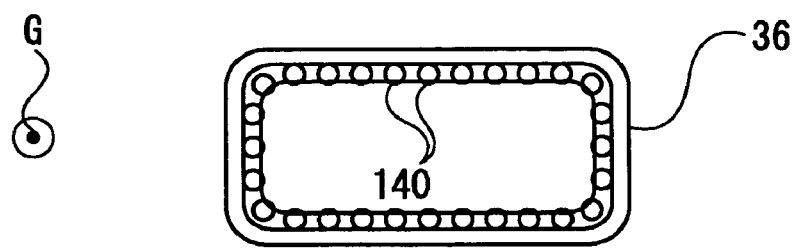
FIG. 25 is a cross-sectional view of the modification, taken along line XXV—XXV in FIG. 21.

FIG. 24 is a sectional view of the container 36 of the heat transfer element 10, taken along line XXIV—XXIV in FIG. 21, and FIG. 25 is a sectional view of the container 36, taken along line XXV—XXV in FIG. 21.

Instead of the grooves 40 shown in FIG. 22, a mesh member 140 is provided as the capillary action member on the inner peripheral surface of a container 36, as shown in FIGS. 24 and 25. The mesh member 140 is made of a highly conductive metal such as copper or aluminum.

Such a mesh member 140 causes working fluid 38 at a heat output section 34 to reflow to a heat input section 30 by a capillary action, in a manner similar to that in the grooves 40 shown in FIG. 22.

Figure 26:
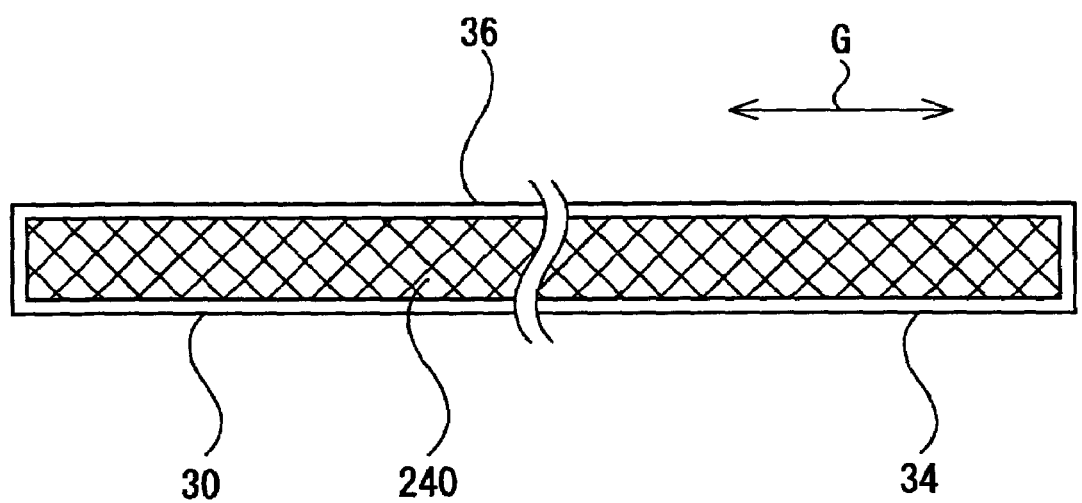
FIG. 26 is a cross-sectional view showing another modification of the container, taken along line XXVI—XXVI in FIG. 21.

FIG. 26 is a cross-sectional view showing a second modification of the second embodiment, taken along line XXVI—XXVI in FIG. 21. In FIG. 26, knurls 240 are provided, instead of the grooves 40 shown in FIG. 22, as the capillary action member on the inner peripheral surface of a container 36. The knurls 240 cause working fluid 38 at a heat output section 34 to reflow to a heat input section 30 by a capillary action.

The mesh member 140 shown in FIG. 24 and the knurls 240 shown in FIG. 26 both functions as the capillary action member, in a manner similar to that in the grooves 40 shown in FIG. 22.

The shape of the container 36 of the heat transfer element 10 may be selected according to the shape of the electronic device shown in FIG. 15 and the layout of the components.

While grooves, a mesh member, and knurls have been given as examples of the capillary action member, sintered powder may also be used. Sintered powder is provided between the heat input section and the heat output section inside the container, and, is made of, for example, pure copper.

The sintered powder has a function of causing working fluid at the heat output section to reflow to the heat input section by a capillary action.

FIG. 13 shows a cooling device according to a third embodiment of the present invention.

Figure 27:
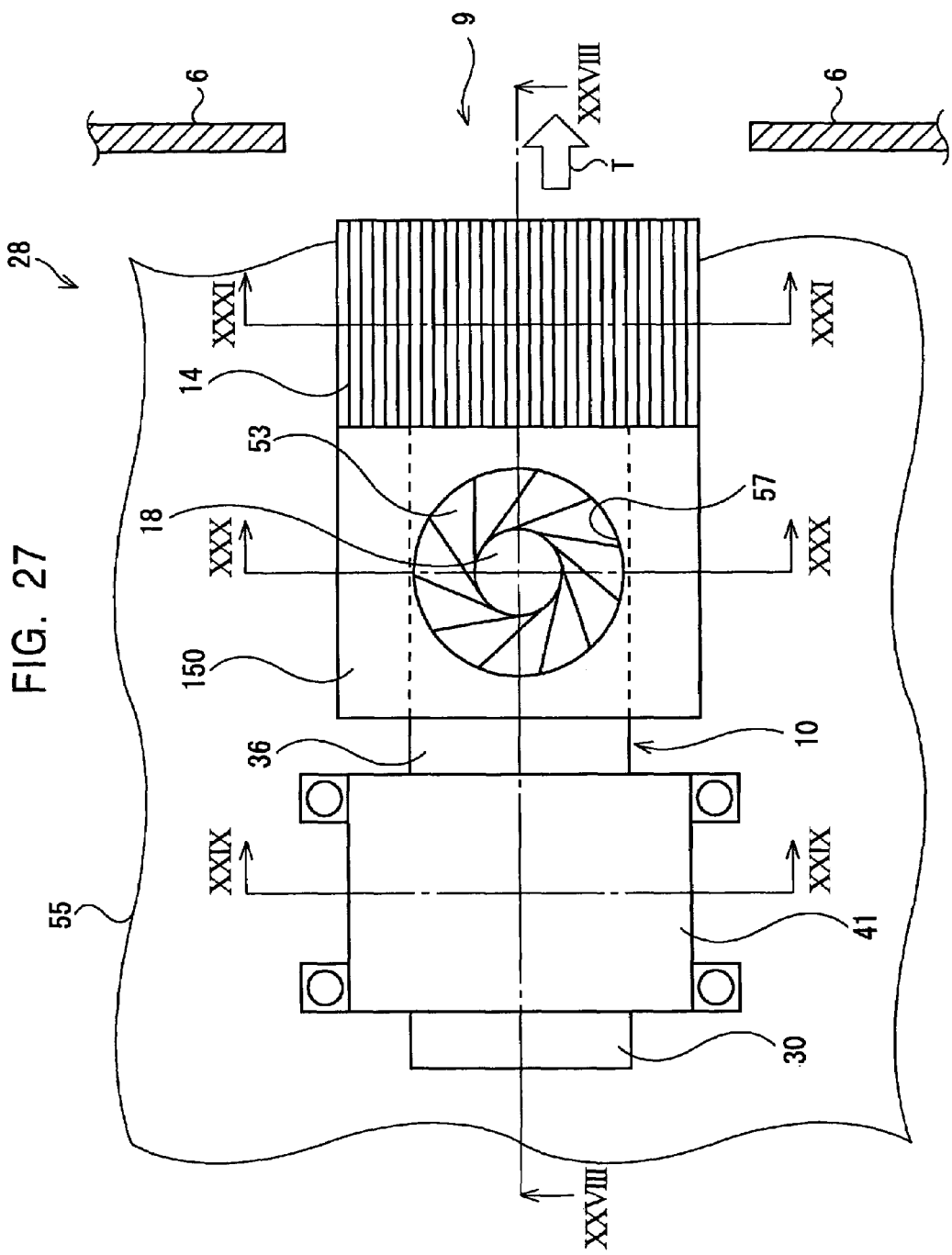
FIG. 27 is a plan view of a cooling device according to a third embodiment of the present invention.

The same components of a cooling device 28 shown in FIG. 27 as those in the cooling device 29 shown in FIG. 16 are denoted by the same reference numerals, and descriptions thereof are omitted.

The cooling device 28 shown in FIG. 27 is different from the cooling device 28 shown in FIG. 16 in the following respects.

That is, a housing 150 shown in FIG. 27 is separate from a container 36 of a heat transfer element 10. In this case, the housing 150 contains a fan motor 18 and a fan 53, and is made of a highly thermoconductive material such as copper or aluminum.

Figure 28:
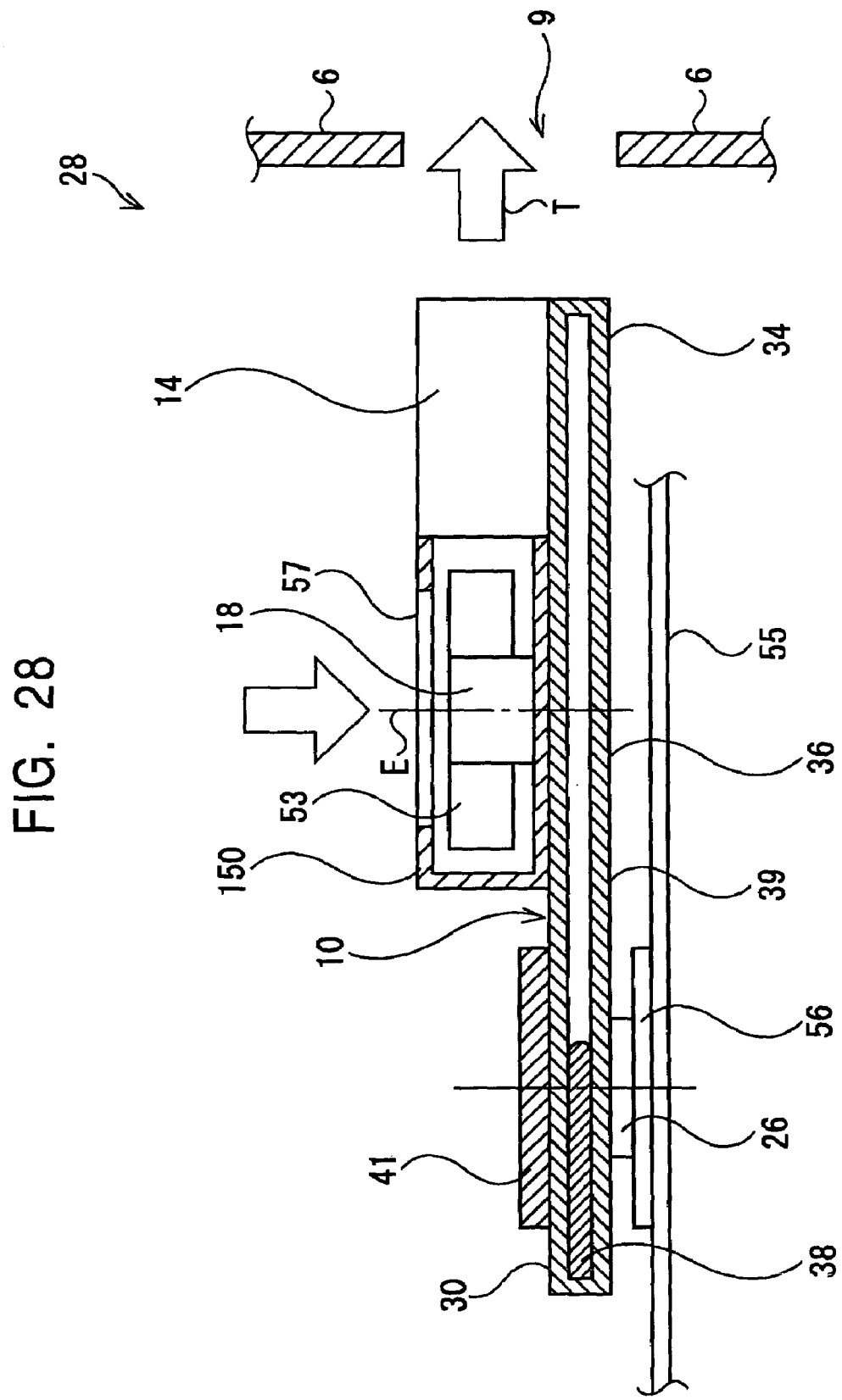
FIG. 28 is a cross-sectional view of the cooling device, taken along line XXVIII—XXVIII in FIG. 27.

While the housing 50 and the container 36 in the second embodiment shown in FIG. 16 are integrally molded from resin, the housing 150 and the container 36 shown in FIG. 27 are separate, as shown in FIG. 28.

Figure 29:
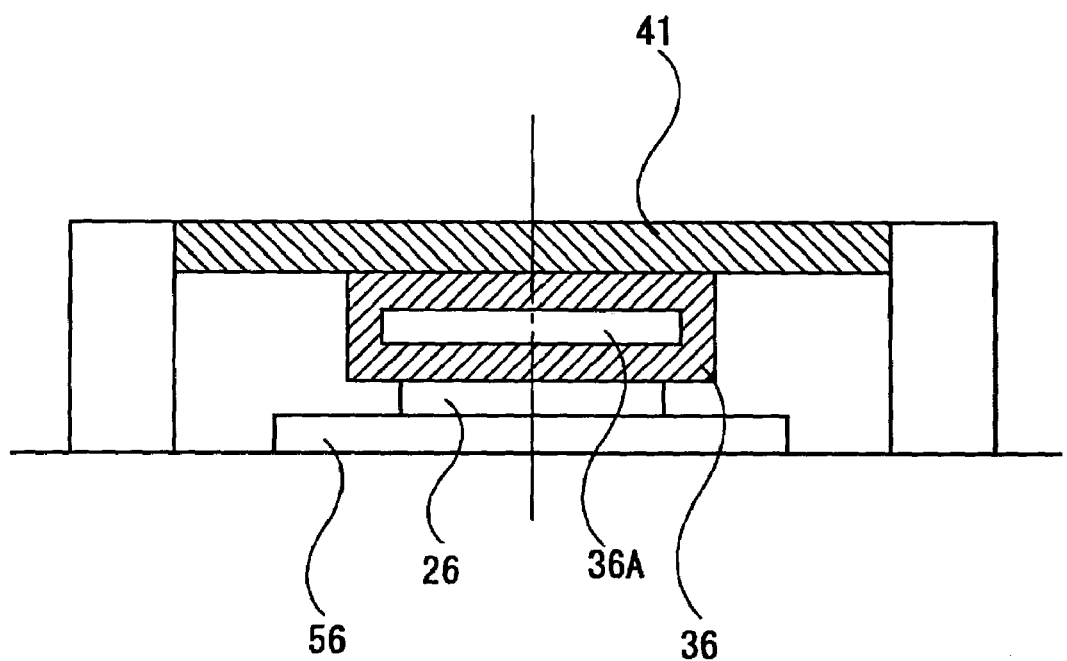
FIG. 29 is a cross-sectional view of the cooling device, taken along line XXIX—XXIX in FIG. 27.
Figure 30:
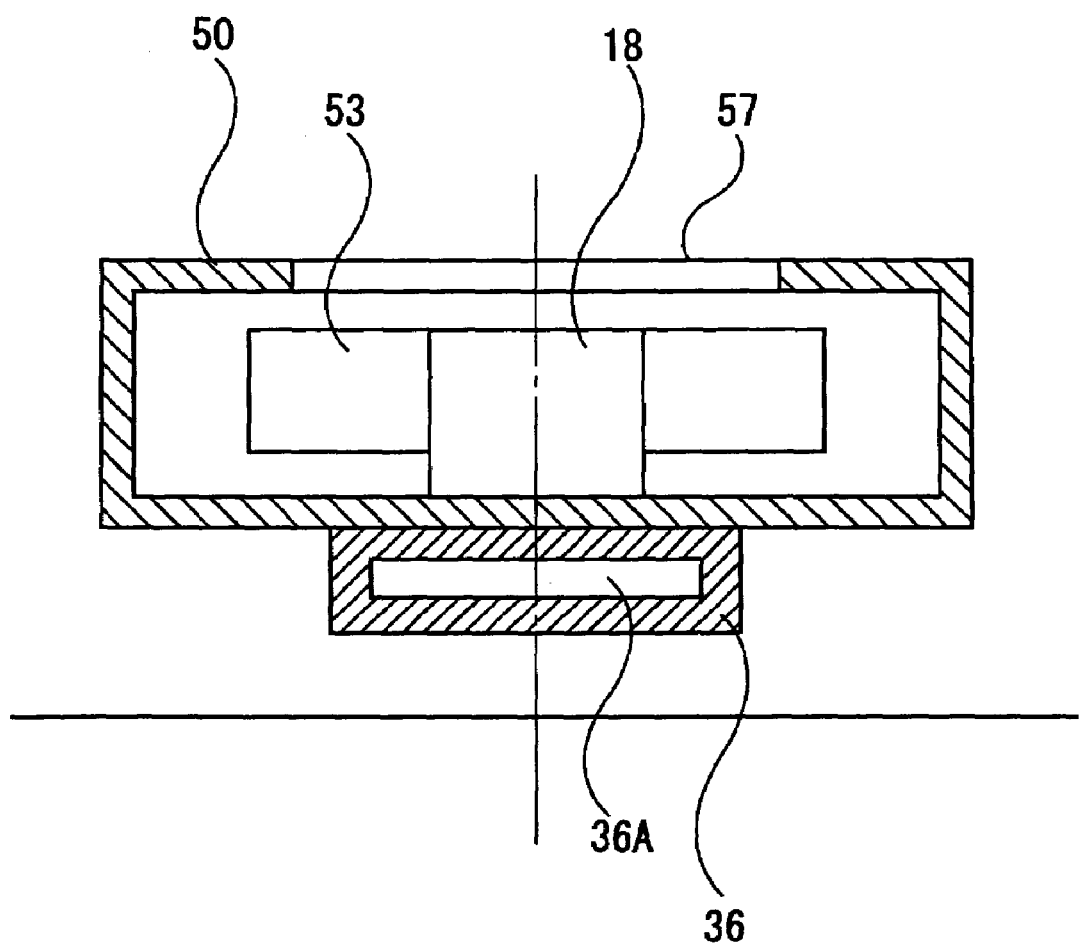
FIG. 30 is a cross-sectional view of the cooling device, taken along line XXX—XXX in FIG. 27.
Figure 31:
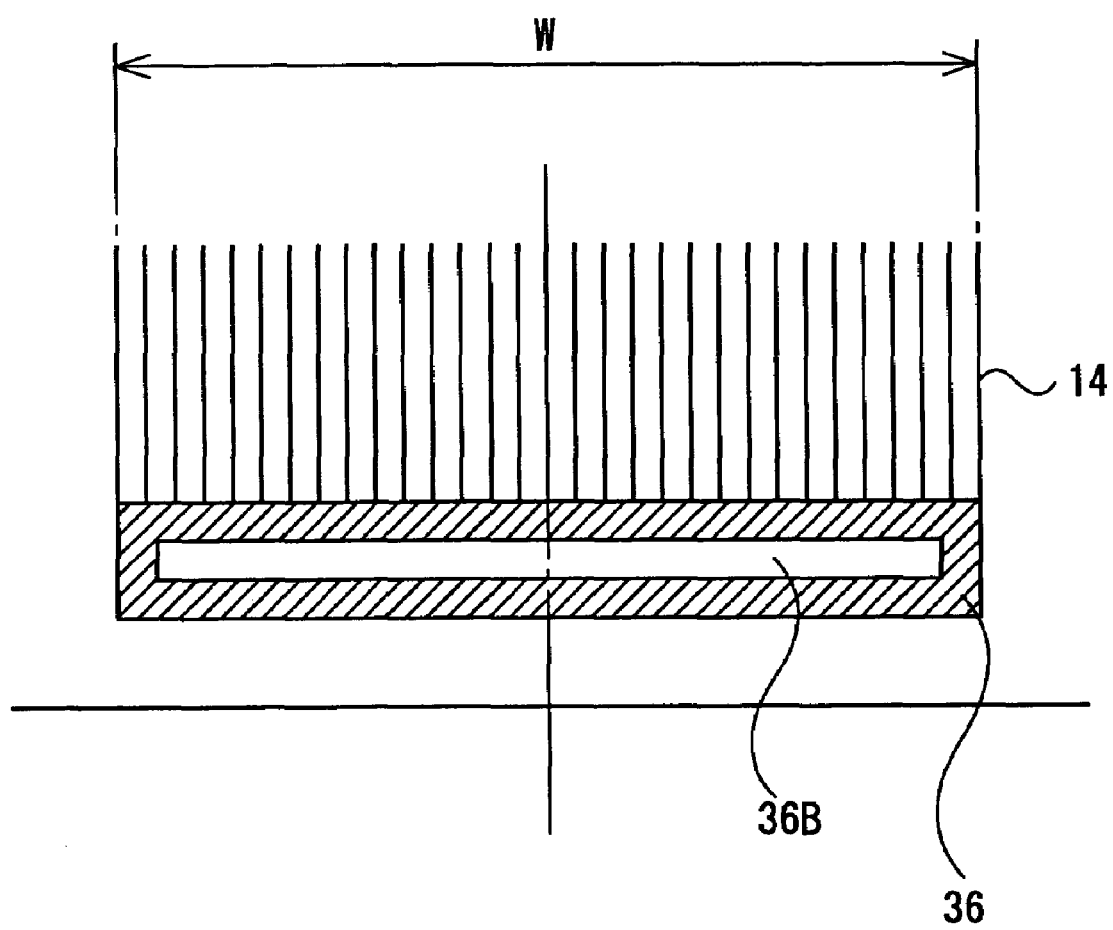
FIG. 31 is a cross-sectional view of the cooling device, taken along line XXXI—XXXI in FIG. 27.

FIGS. 29, 30, and 31 are cross-sectional views, respectively, taken along lines XXIX—XXIX, XXX—XXX, and XXXI—XXXI in FIG. 27.

Figure 32:
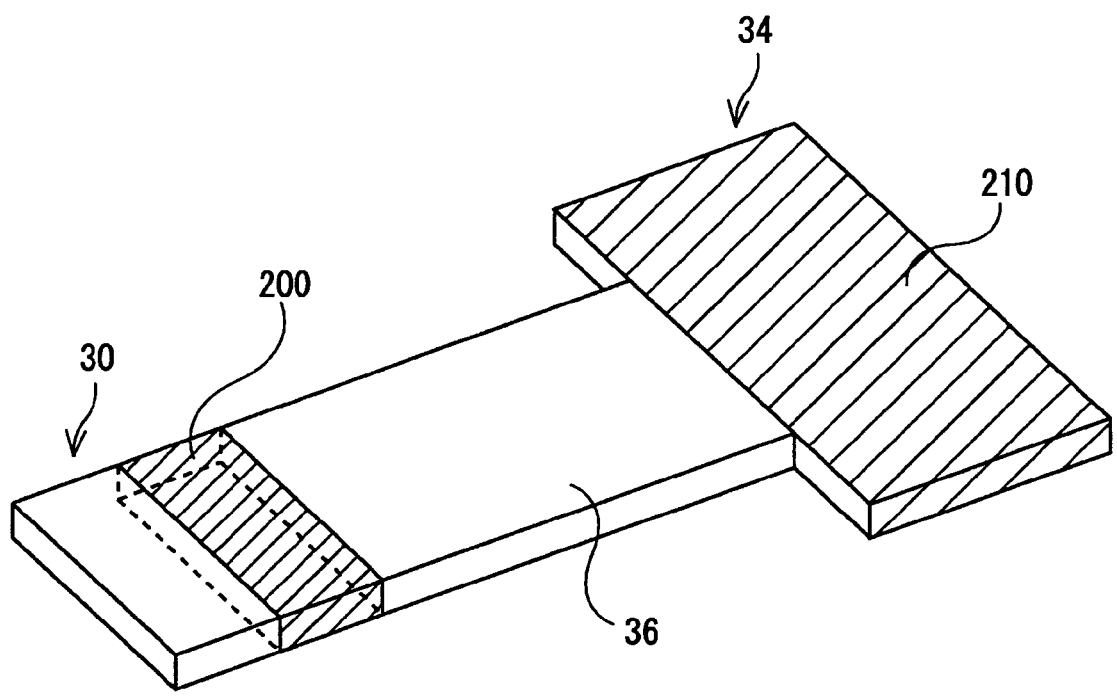
FIG. 32 is a perspective view of a modification of a container shown in FIG. 27.

FIG. 32 shows a cooling device 28 according to a modification of the third embodiment shown in FIGS. 27 to 31. A metal member 200 is provided adjacent to a heat input section 30 of a container 36. Similarly, a metal member 210 is provided adjacent to a heat output section 34 corresponding to the housing 150 and the heat sink 14 shown in FIGS. 30 and 31. The metal members 200 and 210 provided adjacent to the heat input section 30 and the heat output section 34 of the resin container 36 provide the following advantages.

That is, the metal member 200 can establish a good thermal connection between the heat input section 30 of the container 36 and a CPU 26. Similarly, the metal member 210 can establish a good thermal connection between the heat output section 34 of the container 36, and the metal housing 150 and the metal heat sink 14.

In the above embodiments of the present invention, any of the grooves 40, the mesh member 140, the knurls 240, and the sintered powder may be adopted as the capillary action member.

Since the heat transfer element of the present invention is made of resin, it can be flexibly shaped and designed, and the weight thereof can be made smaller than that of the metal heat transfer element. Since the resin container of the heat transfer element contains a thermoconductive material represented by carbon nanotubes, the mechanical strength and thermal conductivity can be increased. In particular, the use of carbon nanotubes allows the container to have an electromagnetic-wave absorbing ability.

Since the container is made of resin, the weight thereof can be made smaller than that of the conventional container made of metal. The resin contains a thermoconductive material to improve its thermal conductivity. Moreover, the resin container can be easily formed not only, for example, in the shape of a pipe, but also in other various shapes.

The condensable working fluid in the container can be reliably moved between the heat input section and the heat output section by using the capillary action member. That is, when heat is applied from the heating element to the heat input section of the container, the working fluid in the container evaporates into vapor.

In this case, latent heat of vaporization is received from the heat input section, and simultaneously, the pressure of the vapor of the working fluid is increased in pressure by other portions of the container. This difference in vapor pressure inside the container allows the vapor of the working fluid to move from the heat input section to the heat output section. Since the pressure and temperature are low in the heat output section, the vapor of the working fluid condenses at the inner wall of the heat output section, and emits latent heat of condensation. The condensed working fluid can reliably reflow to the heat input section by the capillary action member provided in the container.

In a case in which a bar-shaped metal container is bent in an L-shape as before, the radius of a bent portion can be reduced only to approximately three times the pipe width, and the shape thereof cannot be designed flexibly.

In contrast, in the embodiments of the present invention, since the container is made of resin, the radius of a bent portion can be made smaller than in the metal container, and the degree of flexibility in designing the shape is increased.

The heat input section 30 of the container 30 in the cooling device 28 described above is also referred to as an evaporating section, and the heat output section 34 is also referred to as a condensing section. The container 36 is characterized in that the condensable working fluid is vacuum-sealed therein, and in that the capillary action member is provided to exert a capillary action. The container 36 is also characterized in being made of a resin containing a thermoconductive material.

While the present invention has been described with reference to what are presently considered to be the preferred embodiments, it is to be understood that the invention is not limited to the disclosed embodiments.

While the container of the heat transfer element in the cooling device is shaped like a cylinder or a flat pipe in the above-described embodiments, the cross section thereof may, of course, be elliptical, circular, or polygonal, for example, triangular or rectangular, or may be of other shapes.

The shape of the container may be arbitrarily determined according to the layout requirement of an electronic device in which the container is mounted.

While the electronic devices shown in FIGS. 1 and 15 are portable computers, they are not limited thereto as long as they have a heating element.

The heat transfer element and the cooling device of the present invention may be provided in various electronic devices, such as personal digital assistants (PDAs), digital video cameras, digital cameras, car navigation systems, television receivers, image displays, and game machines.

What is claimed is:

1. A heat transfer element, comprising:
   a container having first and second tapered ends, the first tapered end including a heat input section for receiving heat generated by a heating element, and the second tapered end including a heat output section for radiating the heat outside, the container composed of a resin containing a thermoconductive material wherein the container has a groove therein configured to generate a capillary force, the groove extending from the first tapered end to the second tapered end; and
   a coolant in the container, wherein the coolant is transferred as a liquid from the heat output section to the heat input section by the capillary force and the coolant is transferred as a gas from the heat input section to the heat output section by gas pressure, wherein the thermoconductive material forming the container includes carbon nanotubes.

2. A heat transfer element according to claim 1, wherein the thermoconductive material includes graphite.

3. A heat transfer element according to claim 1, wherein the thermoconductive material includes insert-molded graphite sheets.

4. A heat transfer element according to claim 1, wherein the thermoconductive material includes aluminum filler.

5. A heat transfer element according to claim 1, wherein the thermoconductive material includes aluminum nitride filler.

6. A heat transfer element according to claim 1, wherein the capillary action member includes grooves provided between the heat input section and the heat output section inside the container.

7. A heat transfer element according to claim 1, wherein the capillary action member includes a mesh member provided between the heat input section and the heat output section inside the container.

8. A heat transfer element according to claim 1, wherein the capillary action member includes knurls provided between the heat input section and the heat output section inside the container.

9. A heat transfer element according to claim 1, wherein the capillary action member includes sintered powder provided between the heat input section and the heat output section inside the container.

10. An electronic device having a heat transfer element disposed in a casing of the electronic device to transfer heat generated by a heating element, the heat transfer element comprising:
    a container having first and second tapered ends, the first tapered end including a heat input section for receiving the heat generated by the heating element, and the second tapered end including a heat output section for radiating the heat outside, the container composed of a resin containing a thermoconductive material wherein the container has a groove therein configured to generate a capillary force, the groove extending from the first tapered end to the second tapered end; and
    a coolant in the container, wherein the coolant is transferred as a liquid from the heat output section to the heat input section by the capillary force and the coolant is transferred as a gas from the heat input section to the heat output section by gas pressure, wherein the thermoconductive material forming the container includes carbon nanotubes.

11. A cooling device, comprising:
    a heat transfer element that receives heat generated by a heating element from a heat input section and that radiates the heat transferred from the heat input section to the outside from a heat output section;
    a heat sink disposed adjacent to the heat output section of the heat transfer element to radiate the heat received from the heat output section; and
    a fan that rotates to supply cooling air to the heat sink,
    wherein the heat transfer element comprises:
    a container having first and second tapered ends, the first tapered end including the heat input section and the second tapered end including the heat output section, the container composed of a resin containing a thermoconductive material wherein the container has a groove therein configured to generate a capillary force, the groove extending from the first tapered end to the second tapered end; and
    a coolant in the container, wherein the coolant is transferred as a liquid from the heat output section to the heat input section by the capillary force and the coolant is transferred as a gas from the heat input section to the heat output section by gas pressure,
    wherein the thermoconductive material forming the container includes carbon nanotubes.

12. A cooling device according to claim 11, wherein the fan is disposed inside a housing that is formed integrally with the container.

13. An electronic device having a cooling device for performing cooling by radiating heat generated by a heating element to the outside, the cooling device comprising:
    a heat transfer element that receives the heat generated by the heating element from a heat input section and that radiates the heat transferred from the heat input section to the outside from a heat output section;
    a heat sink disposed adjacent to the heat output section of the heat transfer element to radiate the heat from the heat output section; and
    a fan that rotates to supply cooling air to the heat sink,
    wherein the heat transfer element comprises:
    a container having first and second tapered ends, the first tapered end including the heat input section and the second tapered end including the heat output section, the container composed of a resin containing a thermoconductive material wherein the container has a groove therein configured to generate a capillary force, the groove extending from the first tapered end to the second tapered end; and
    a coolant in the container, wherein the coolant is transferred as a liquid from the heat output section to the heat input section by the capillary force and the coolant is transferred as a gas from the heat input section to the heat output section by gas pressure,
    wherein the thermoconductive material forming the container includes carbon nanotubes.

14. An electronic device according to claim 13, wherein the fan is disposed inside a housing that is formed integrally with the container.

* * * * *

UNITED STATES PATENT AND TRADEMARK OFFICE
CERTIFICATE OF CORRECTION

| | | |
|---|---|---|
| PATENT NO. | : 7,258,160 B2 | Page 1 of 1 |
| APPLICATION NO. | : 10/669057 | |
| DATED | : August 21, 2007 | |
| INVENTOR(S) | : Toshio Hashimoto | |

It is certified that error appears in the above-identified patent and that said Letters Patent is hereby corrected as shown below:

Column 4, line 40, please insert the following text before "FIG. 13":

--FIG. 12 is a sectional-view of the heat transfer element, taken along line XII-XII in FIG. 11;--

Signed and Sealed this

Sixteenth Day of September, 2008

JON W. DUDAS
*Director of the United States Patent and Trademark Office*